US010623017B2

(12) United States Patent
Kobayashi

(10) Patent No.: US 10,623,017 B2
(45) Date of Patent: Apr. 14, 2020

(54) ARITHMETIC CODING DEVICE, ARITHMETIC CODING METHOD, AND ARITHMETIC CODING CIRCUIT

(71) Applicant: NEC Corporation, Minato-ku, Tokyo (JP)

(72) Inventor: Eita Kobayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/098,153

(22) PCT Filed: May 10, 2017

(86) PCT No.: PCT/JP2017/017761
§ 371 (c)(1),
(2) Date: Nov. 1, 2018

(87) PCT Pub. No.: WO2017/195843
PCT Pub. Date: Nov. 16, 2017

(65) Prior Publication Data
US 2019/0158113 A1 May 23, 2019

(30) Foreign Application Priority Data

May 13, 2016 (JP) .................. 2016-096693

(51) Int. Cl.
*H03M 7/40* (2006.01)
*H04N 19/91* (2014.01)
*H04N 19/436* (2014.01)

(52) U.S. Cl.
CPC ........... *H03M 7/4006* (2013.01); *H03M 7/40* (2013.01); *H03M 7/4018* (2013.01); *H04N 19/436* (2014.11); *H04N 19/91* (2014.11)

(58) Field of Classification Search
CPC .... H03M 7/4006; H03M 7/40; H03M 7/4018; H04N 19/436
(Continued)

(56) References Cited

U.S. PATENT DOCUMENTS 10,462,463 B2 * 10/2019 Sasai .................... H04N 19/167
10,491,900 B2 * 11/2019 Ikai ........................ H04N 19/44
(Continued)

FOREIGN PATENT DOCUMENTS

| JP | 2008113374 A | 5/2008 |
| WO | 2013069246 A1 | 5/2013 |
| WO | 2013183232 A1 | 12/2013 |

OTHER PUBLICATIONS

Dajiang Zhou, et al ., "Ultra-High-Throughput VLSI Architecture of H.265/HEVC CABAC Encoder for UHDTV Applicat ions", IEEE Transactions on Circuit and Systems for Video Technocology, Mar. 2015, vol. 25, No. 3 (12 pages).

*Primary Examiner* — Brian K Young

(57) ABSTRACT

Provided is, for example, an arithmetic coding device capable of coding, at high speed, a symbol sequence including a context symbol and a bypass symbol. The arithmetic coding device updates an occurrence probability of a context symbol for a symbol sequence including the context symbol and a bypass symbol; updates a numerical range for the symbol sequence based on the updated occurrence probability; updates the updated numerical range based on a predetermined probability, the numerical range being a basis of an arithmetic code, the numerical range being updated in accordance with the occurrence probability of the context symbol and the predetermined probability for the bypass symbol; and generates an arithmetic code of the symbol sequence based on the updated numerical range in accordance with a procedure of generating the arithmetic code.

10 Claims, 18 Drawing Sheets

(58) Field of Classification Search
USPC .......................................... 341/67, 107, 106
See application file for complete search history.

(56) References Cited

U.S. PATENT DOCUMENTS

| | | | |
|---|---|---|---|
| 10,499,074 B2 * | 12/2019 | Said | ....................... H04N 19/44 |
| 2013/0177069 A1 | 7/2013 | Sze et al. | |
| 2013/0272389 A1 | 10/2013 | Sze et al. | |

* cited by examiner

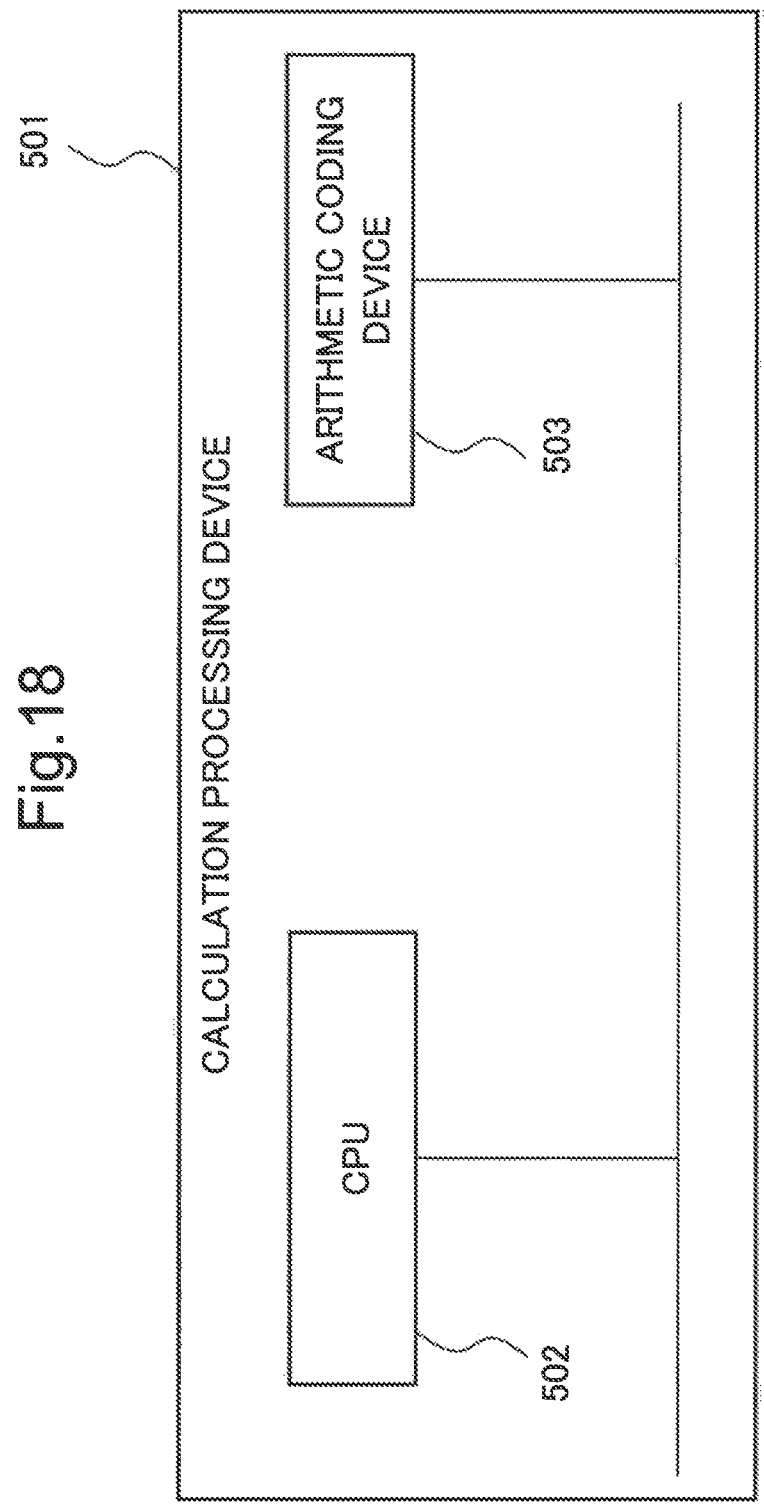

ARITHMETIC CODING DEVICE, ARITHMETIC CODING METHOD, AND ARITHMETIC CODING CIRCUIT

This application is a National Stage Entry of PCT/JP2017/017761 filed on May 10, 2017, which claims priority from Japanese Patent Application 2016-096693 filed on May 13, 2016, the contents of all of which are incorporated herein by reference, in their entirety.

TECHNICAL FIELD

The present invention relates to arithmetic coding device that encodes data in accordance with an arithmetic coding and the like.

BACKGROUND ART

NPL 1 discloses High Efficiency Video Coding (HECV) that is an image coding method based on H.265 standard recommended by ITU-T. ITU-T is an abbreviation of "International Telecommunication Union Telecommunication Standardization Sector". H.265 is a video compression standard.

In HEVC, each frame constituting a digitalized image is divided into coding tree units (CTUs) and each CTU is coded in the raster scan order. Each CTU has a quadtree structure divided into four coding units (CUs). Each CU is divided into units called prediction units (PUs). Each CU performs motion compensation prediction and image prediction for each divided PU. Prediction error resulting from these predictions performed by each CU is divided into a quadtree of transform units (TUs) and the divided prediction error is frequency-converted. The frequency-converted prediction error is quantized per TU and then coded by an arithmetic coding unit.

The arithmetic coding unit performs coding according to the following procedure. First, configuration information for CU, PU, and TU and post-quantization prediction residual, inputted by indicates of a plurality of signals, are transformed to a symbol sequence by a binarization unit. A symbol takes a value of, for example, 0 or 1. The post-quantization prediction residual is transformed to a symbol sequence (a symbol sequence includes 0 or 1) by a transform technique chosen to be appropriate for the syntax of the symbol sequence.

Next, arithmetic coding is performed by using the inputted symbol sequence, symbol sequences formed according to syntaxes, and contexts determined according to the syntaxes. When a plurality of symbol sequences are formed in accordance with a syntax, various contexts may be generated depending on the symbols included in the symbol sequences. A context includes a pair of a most probable symbol (MPS) and the occurrence probability of the MPS. In HEVC, occurrence probability and changes of occurrence probability are represented by 61 states and state transitions between the states. Context-dependent symbols are called context symbols. Hereinafter, it is assumed that a context symbol indicates a context-dependent symbol.

HEVC also includes special symbols not dependent on a context (independent symbols). Such special symbols are called bypass symbols. The occurrence probability of a bypass symbol is fixed at a predetermined probability (e.g., 50%). There is no need for updating the context for a bypass symbol since the occurrence probability of a bypass symbol is fixed. Therefore, the computational complexity of the coding processing of a bypass symbol is smaller than that of a context symbol. Hereinafter, a bypass symbol indicates a symbol not dependent on a context (an independent symbol).

Examples of arithmetic coding devices are disclosed in NPL 1 and PTL 1.

An arithmetic coding device described in NPL 1 includes a context symbol processing unit configured with engines connected in series for the coding processing of context symbols and capable of processing as many as four context symbols at one time. The arithmetic coding device separates a symbol sequence into context symbols and bypass symbols. The context symbols and the bypass symbols thus separated are respectively coded by separate processing indicates.

PTL 1 discloses a video coding device for generating a code for an input image in accordance with a generation technique of an arithmetic code. The video coding device converts a type of processing applied to pixel values of decoded image into a binary signal and codes the converted binary signal in accordance with a procedure for coding bypass symbols. The pixel values is in an image obtained by decoding a code sequence of the coded input image.

CITATION LIST

Patent Literature

PTL 1: PCT International Publication No. WO 2013/183232

Non-Patent Literature

NPL 1: "Ultra-high-throughput VLSI architecture of H.265/HEVC CABAC encoder for UHDTV applications", Dajiang Zhou, Jinjia Zhou, Wei Fei, and Satoshi Goto, IEEE Transactions on Circuits an Systems for Video Technology (TCSVT), Vol. 25, No. 3, pp. 497-507, March 2015.

SUMMARY OF INVENTION

Technical Problem

However, neither the video coding device disclosed in PTL 1 nor the arithmetic coding device disclosed in NPL 1 can process a symbol sequence that includes a context symbol and a bypass symbol at a high speed. The reason is as follows. The context symbol processing unit described in NPL 1 can process at a high speed a symbol sequence including only context symbols but cannot process a symbol sequence formed differently from such a symbol sequence. Thus, the arithmetic coding device described in NPL 1 cannot process at a high speed a symbol sequence that includes a context symbol and a bypass symbol. Further, the video coding device disclosed in PTL 1 is not configured to process at a high speed a symbol sequence including various symbols.

An object of the present invention is to provide an arithmetic coding device and the like capable of coding at a high speed even a symbol sequence that includes a context symbol and a bypass symbol.

Solution to Problem

As an aspect of the present invention, an arithmetic coding device including:

update means for updating an occurrence probability of a context symbol for a symbol sequence including the context symbol and a bypass symbol, updating a numerical range for the symbol sequence based on the updated occurrence probability, and updating the updated numerical range based on a predetermined probability, the numerical range being a basis of an arithmetic code, the numerical range being updated in accordance with the occurrence probability of the context symbol and the predetermined probability for the bypass symbol; and processing means for generating an arithmetic code of the symbol sequence based on the numerical range updated by the update means in accordance with a procedure of generating the arithmetic code.

In addition, as another aspect of the present invention, an arithmetic coding method including:

updating an occurrence probability of a context symbol for a symbol sequence including the context symbol and a bypass symbol, updating a numerical range for the symbol sequence based on the updated occurrence probability, and updating the updated numerical range based on a predetermined probability, the numerical range being a basis of an arithmetic code, the numerical range being updated in accordance with the occurrence probability of the context symbol and the predetermined probability for the bypass symbol; and generating an arithmetic code of the symbol sequence based on the updated numerical range in accordance with a procedure of generating the arithmetic code.

In addition, as another aspect of the present invention, an arithmetic coding circuit including:

an update circuit for updating an occurrence probability of a context symbol for a symbol sequence including the context symbol and a bypass symbol, updating a numerical range for the symbol sequence based on the updated occurrence probability, and updating the updated numerical range based on a predetermined probability, the numerical range being a basis of an arithmetic code, the numerical range being updated in accordance with the occurrence probability of the context symbol and the predetermined probability for the bypass symbol; and a processing circuit for generating an arithmetic code of the symbol sequence based on the numerical range updated by the update circuit in accordance with a procedure of generating the arithmetic code.

Advantageous Effects of Invention

An arithmetic coding device and the like according to the present invention can code even a symbol sequence including a context symbol and a bypass symbol at a high speed.

BRIEF DESCRIPTION OF DRAWINGS

FIG. 18 is a block diagram illustrating a configuration of a calculation processing device including an arithmetic coding device.

EXAMPLE EMBODIMENT

Next, example embodiments of the present invention will be described in detail with reference to the drawings.

First Example Embodiment

Figure 1:
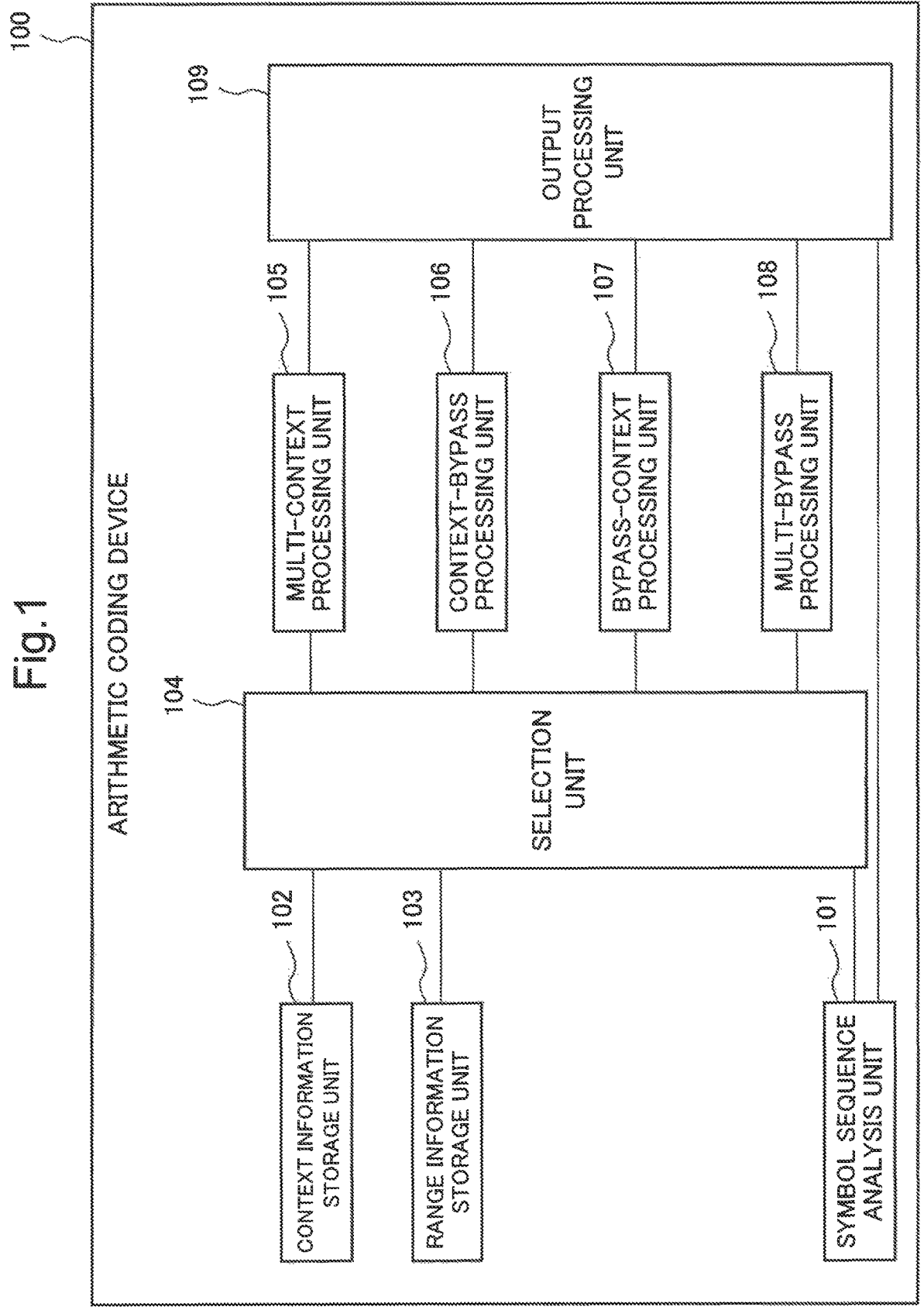
FIG. 1 is a block diagram illustrating a configuration of an arithmetic coding device according to a first example embodiment of the present invention.

With reference to FIG. 1, a configuration of an arithmetic coding device 100 according to a first example embodiment of the present invention will be described in detail. FIG. 1 is a block diagram illustrating a configuration of the arithmetic coding device 100 according to the first example embodiment of the present invention.

The arithmetic coding device 100 according to the first example embodiment includes a symbol sequence analysis unit (symbol sequence analyzer) 101, a context information storage unit 102, a range information storage unit 103, a selection unit (selector) 104, a multi-context processing unit (multi-context processor) 105, and a context-bypass processing unit (context-bypass processor) 106. The arithmetic coding device 100 further includes a bypass-context processing unit (bypass-context processor) 107, a multi-bypass processing unit (bypass-context processor) 108, and an output processing unit (output processor) 109.

With reference to FIGS. 2 to 6, configurations of the selection unit 104, the multi-context processing unit 105, the context-bypass processing unit 106, the bypass-context processing unit 107, and the multi-bypass processing unit 108 will be described.

Figure 2:
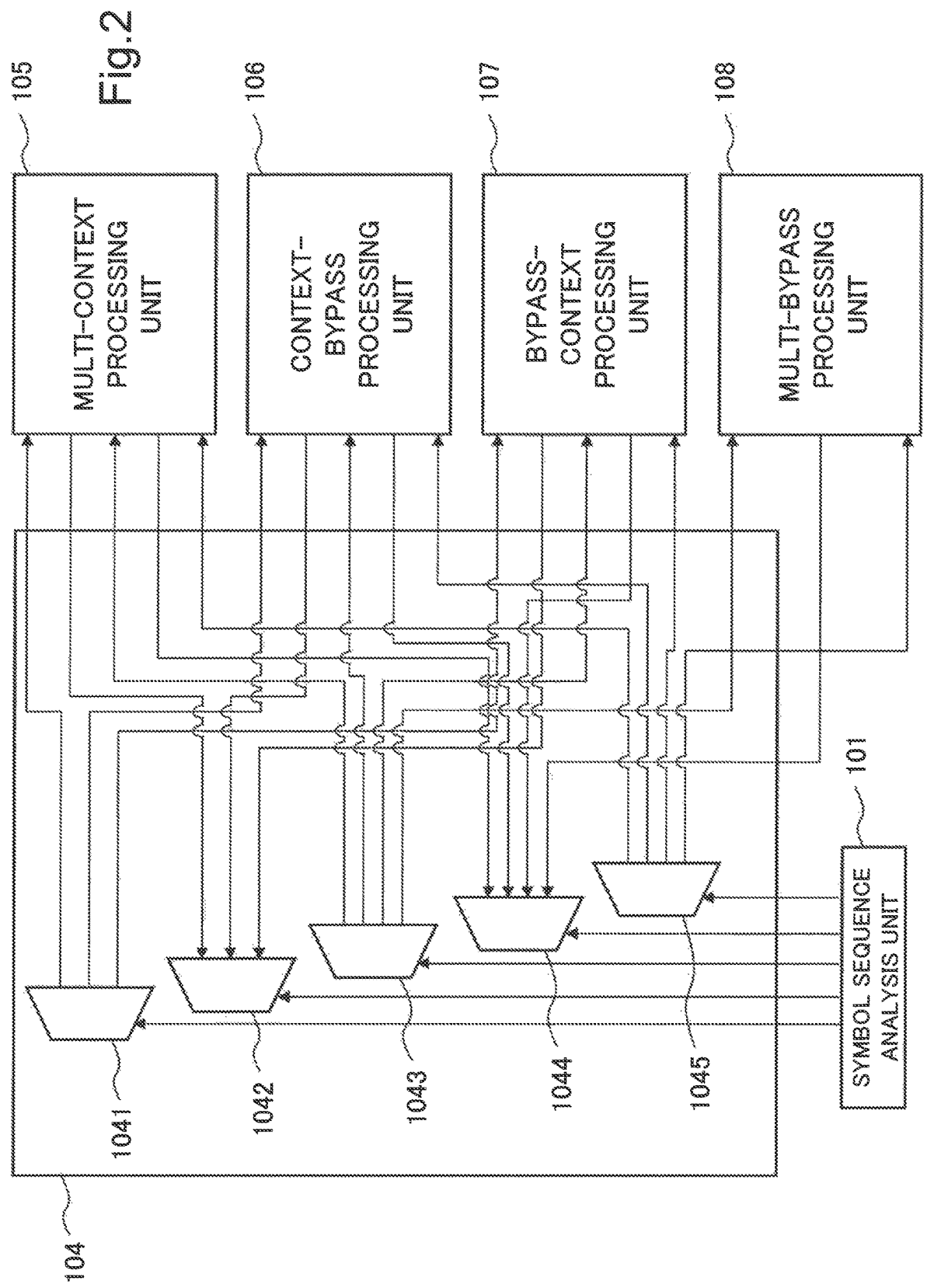
FIG. 2 is a block diagram illustrating a configuration of a selection unit according to the first example embodiment.

First, with reference to FIG. 2, a configuration of the selection unit 104 according to the first example embodiment will be described in detail. FIG. 2 is a block diagram illustrating a configuration of the selection unit 104 according to the first example embodiment.

The selection unit 104 includes an input context information selection unit (input context information selector) 1041, an output context information processing unit (output context information processor) 1042, an input range information selection unit (input range information selector) 1043, an output range information selection unit (output range information selector) 1044, and an input multi-symbol selection unit (input multi-symbol selector) 1045.

The input context information selection unit 1041 selectively outputs context information stored in the context information storage unit 102 to a processing unit indicated by destination information, which will be described later. Context information indicates the occurrence probability with respect to a context symbol. The output context information processing unit 1042 selectively receives, as an input, destination information outputted by the processing unit and stores the inputted destination information in the context information storage unit 102. The input range information selection unit 1043 selectively outputs the range information stored in the range information storage unit 103 to a processing unit indicated by destination information, which will be described later. The output range information selection unit 1044 selectively receives, as an input, range information outputted by the processing unit and stores the inputted destination information in the range information storage unit 103 (range information will be described later together with the description of the arithmetic code generation processing). The input multi-symbol selection unit 1045 selectively outputs a symbol sequence to be analyzed to the processing unit indicated by destination information, which will be described later.

As has been described in relation to the background art, a context symbol is a context-dependent symbol. Therefore, as has been described in relation to the background art, a context symbol is a target symbol of arithmetic code generation processing based on the occurrence (appearance) probability of a context symbol. A bypass symbol is a symbol independent of a context (an independent symbol). Therefore, as described in relation to the background art, a bypass symbol is a target symbol of arithmetic code generation processing based on a predetermined probability.

Figure 3:
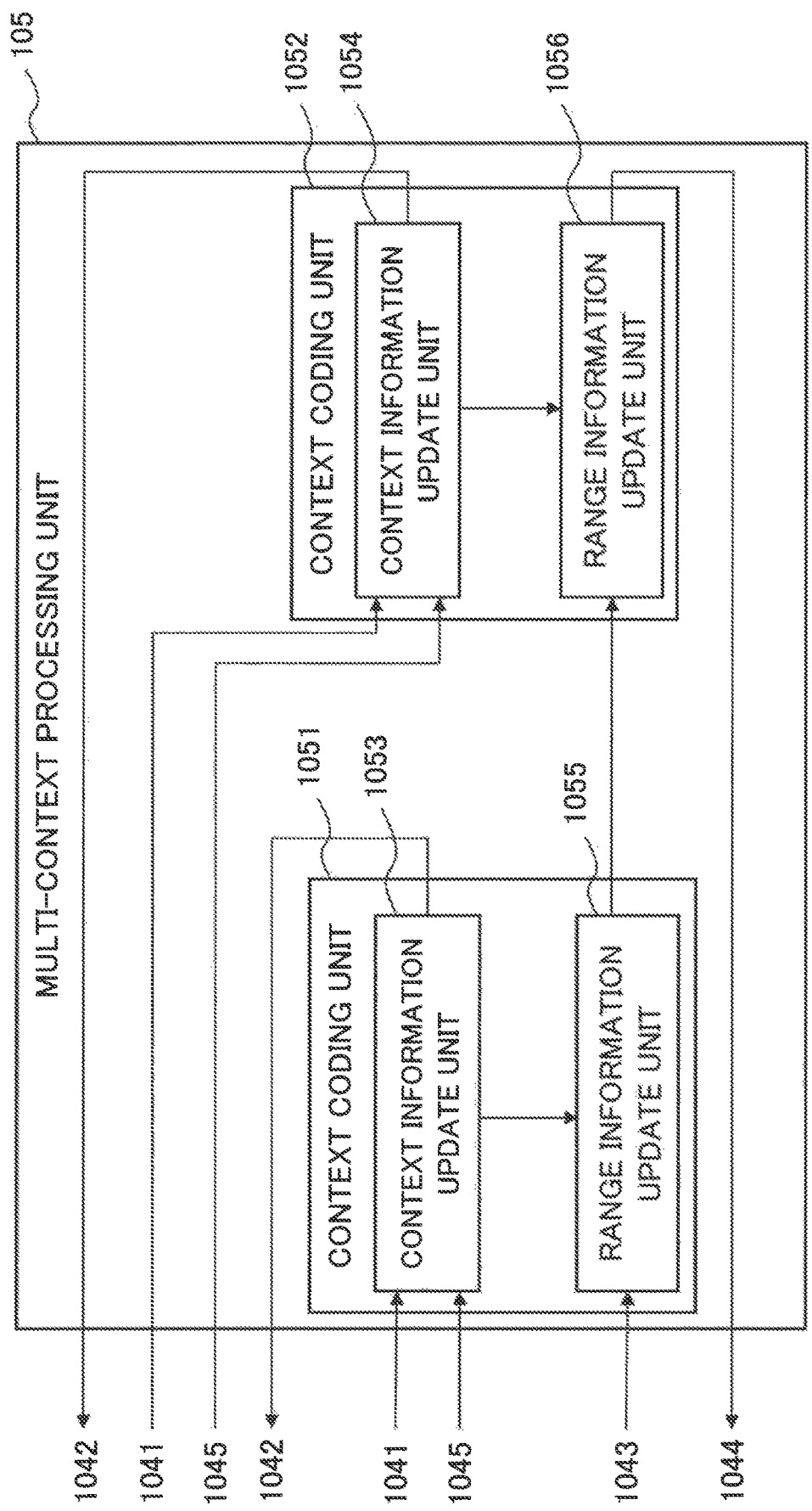
FIG. 3 is a block diagram illustrating a configuration of a multi-context processing unit according to the first example embodiment.

With reference to FIG. 3, a configuration of the multi-context processing unit 105 according to the first example embodiment will be described in detail. FIG. 3 is a block diagram illustrating a configuration of a multi-context processing unit 105 according to the first example embodiment.

The multi-context processing unit 105 includes a context coding unit (context coder) 1051 and a context coding unit 1052. The context coding unit 1051 includes a context information update unit (context information updater) 1053 and a range information update unit (range information updater) 1055. The context coding unit 1052 includes a context information update unit 1054 and a range information update unit 1056. The context coding unit 1051 and the context coding unit 1052 have the same function. The context information update unit 1053 and the context information update unit 1054 have the same function. The range information update unit 1055 and the range information update unit 1056 have the same function. The processing in the multi-context processing unit 105 will be described by referring FIG. 3 once again after description of the arithmetic code generation processing.

Figure 4:
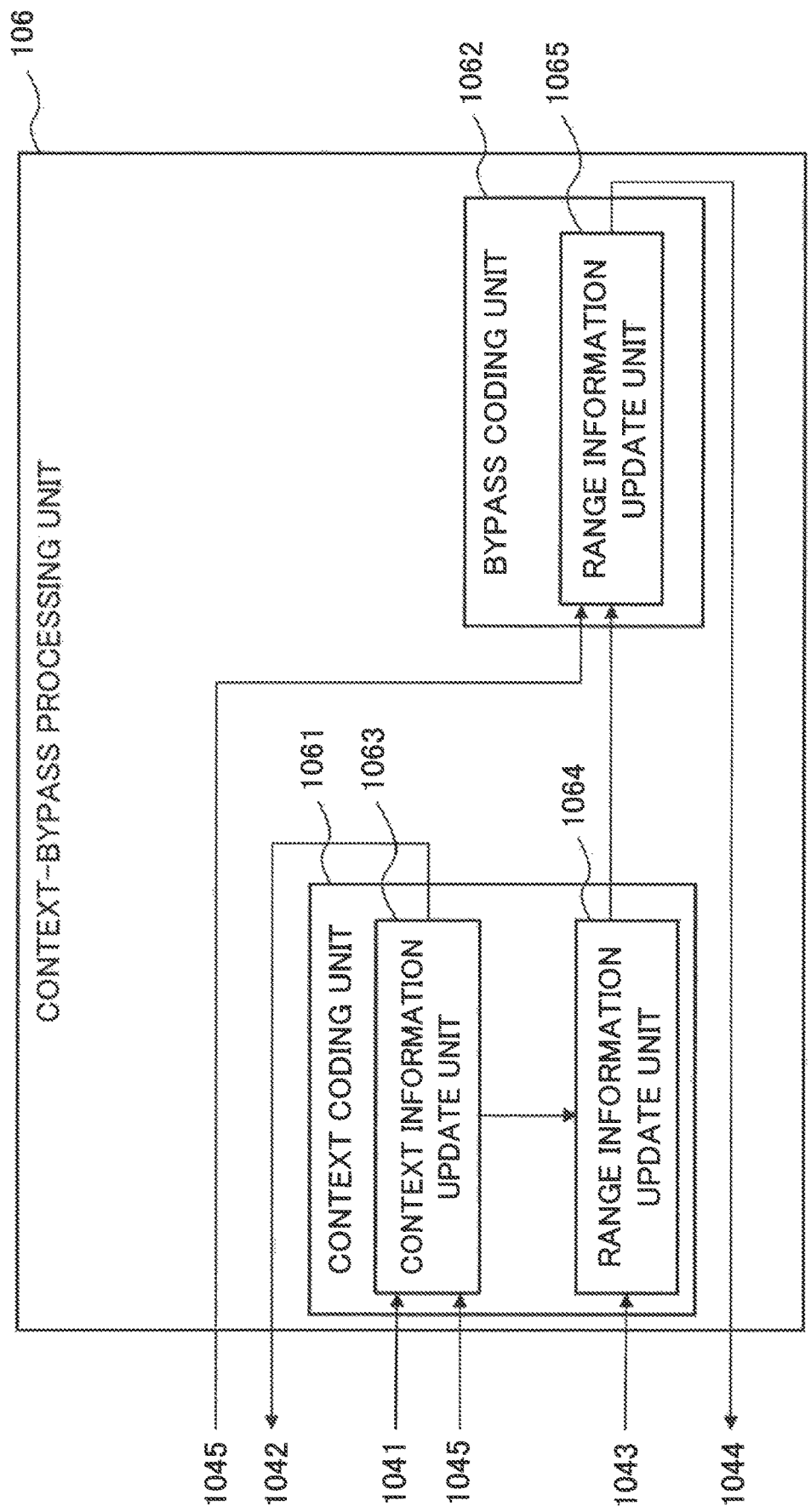
FIG. 4 is a block diagram illustrating a configuration of a context-bypass processing unit according to the first example embodiment.

With reference to FIG. 4, a configuration of the context-bypass processing unit 106 according to the first example embodiment will be described in detail. FIG. 4 is a block diagram illustrating a configuration of the context-bypass processing unit 106 according to the first example embodiment.

The context-bypass processing unit 106 includes a context coding unit (context coder) 1061 and a bypass coding unit (bypass coder) 1062. The context coding unit 1061 includes a context information update unit (context information updater) 1063 and a range information update unit (range information updater) 1064. The bypass coding unit 1062 includes a range information update unit (range information updater) 1065. The context coding unit 1061 has a function similar to the function of the context coding unit 1051 or the context coding unit 1052 illustrated in FIG. 3. The context information update unit 1063 has a function similar to the function of the context information update unit 1053 or the context information update unit 1054 illustrated in FIG. 3. The range information update unit 1064 has a function similar to the function of the range information update unit 1055 or the range information update unit 1056 illustrated in FIG. 3. Processing of the context-bypass processing unit 106 will be described by referring FIG. 4 once again after description of arithmetic code generation processing.

Figure 5:
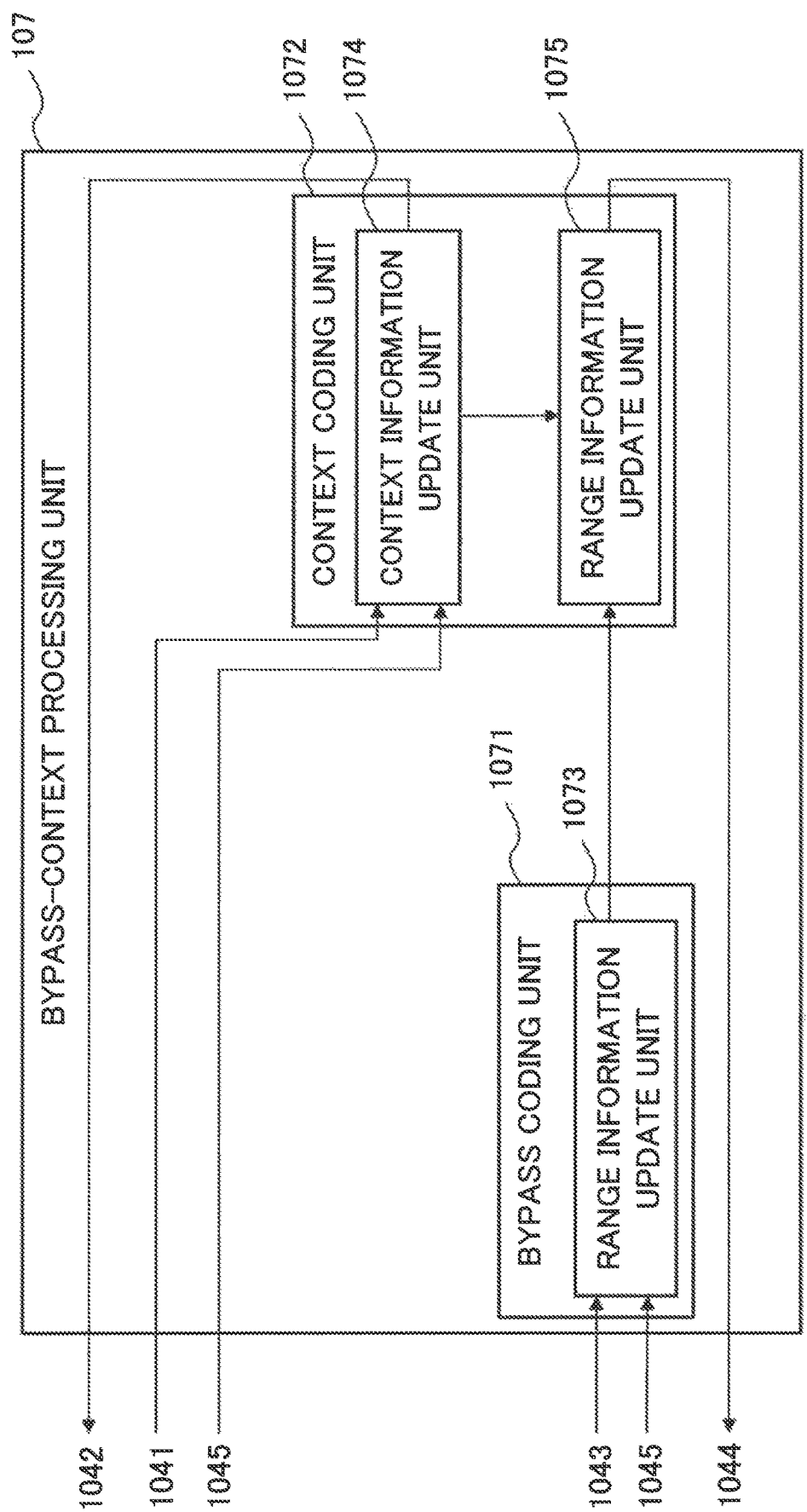
FIG. 5 is a block diagram illustrating a configuration of a bypass-context processing unit according to the first example embodiment.

With reference to FIG. 5, a configuration of the bypass-context processing unit 107 according to the first example embodiment will be described in detail. FIG. 5 is a block diagram illustrating a configuration of the bypass-context processing unit 107 according to the first example embodiment.

The bypass-context processing unit 107 includes a bypass coding unit (bypass coder) 1071 and a context coding unit (context coder) 1072. The bypass coding unit 1071 includes a range information update unit (range information updater) 1073. The context coding unit 1072 includes a context information update unit (context information updater) 1074 and a range information update unit (range information updater) 1075. The bypass coding unit 1071 has a function similar to the function of the bypass coding unit 1062 illustrated in FIG. 4. The context coding unit 1072 has a function similar to the function of the context coding unit 1051 illustrated in FIG. 3.

The bypass-context processing unit 107 is configured differently from the context-bypass processing unit 106 (FIG. 4) in that, for example, the inputted range information is updated by the bypass coding unit 1071 and the updated range information is inputted to the context coding unit 1072. Processing of the bypass-context processing unit 107 will be described by referring FIG. 5 once again after description of arithmetic code generation processing.

Figure 6:
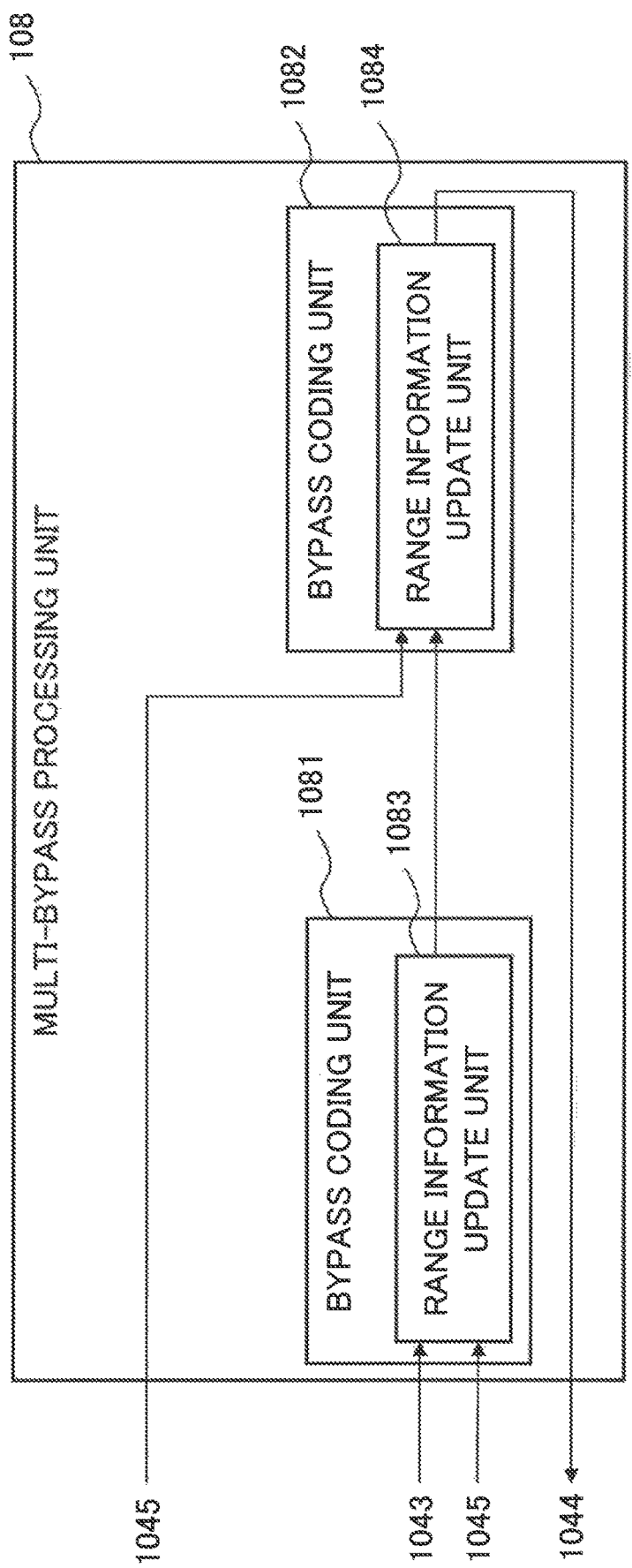
FIG. 6 is a block diagram illustrating a configuration of a multi-bypass processing unit according to first example embodiment.

With reference to FIG. 6, a configuration of the multi-bypass processing unit 108 according to the first example embodiment will be described in detail. FIG. 6 is a block diagram illustrating a configuration of the multi-bypass processing unit 108 according to first example embodiment.

The multi-bypass processing unit 108 includes a bypass coding unit (bypass coder) 1081 and a bypass coding unit 1082. The bypass coding unit 1081 includes a range information update unit (range information updater) 1083. The bypass coding unit 1082 includes a range information update unit 1084. The bypass coding unit 1081 and the bypass coding unit 1082 have a function similar to the function of the bypass coding unit 1062 illustrated in FIG. 4. Processing of the multi-bypass processing unit 108 will be described by referring FIG. 6 once again after description of arithmetic code generation processing.

Next, with reference to FIG. 1, processing of the arithmetic coding device 100 will be described.

In the arithmetic coding device 100, when given a symbol sequence that includes at least one of a bypass symbol and a context symbol as an analysis target, the symbol sequence analysis unit 101 analyzes (distinguishes) the first two symbols of the symbol sequence. Herein, "to analyze" indicates to specify an order of symbols in a symbol sequence. A bypass symbol and a context symbol may be adjacent to each other in the symbol sequence. In the processing for the analysis of the symbol sequence, the symbol sequence analysis unit 101 specifies the order of the first two symbols and selects the processing unit capable of processing the symbol sequence including the specified order of the first two symbols. The processing unit is one of the processing units in FIG. 1, i.e., the multi-context processing unit 105, the context-bypass processing unit 106, the bypass-context processing unit 107, or the multi-bypass processing unit 108.

Processing of the arithmetic coding device 100 will be described more specifically according to symbols included in the symbol sequence.

When the first two symbols of the symbol sequence to be an analysis target are both context symbols, the symbol sequence analysis unit 101 in the arithmetic coding device 100 selects the multi-context processing unit 105 as the processing unit capable of processing the two symbols. When the first two symbols of the symbol sequence are both bypass symbols, the symbol sequence analysis unit 101 in the arithmetic coding device 100 selects the multi-bypass processing unit 108 as the processing unit capable of processing the two symbols. When the first two symbols of the symbol sequence are a context symbol and a bypass symbol adjacent to each other in this order, the symbol sequence analysis unit 101 selects the context-bypass processing unit 106 as the processing unit capable of processing the two symbols. When the first two symbols of the symbol sequence are a bypass symbol and a context symbol adjacent to each other in this order, the symbol sequence analysis unit 101 selects the bypass-context processing unit 107 as the processing unit capable of processing the two symbols.

The symbol sequence analysis unit 101 generates destination information indicating the processing unit selected as the processing unit capable of processing the two symbols and outputs the generated destination information and the two symbols to the selection unit 104.

The selection unit 104 receives as an input the two symbols and the destination information outputted by the symbol sequence analysis unit 101. When at least one of the two symbols is a context symbol, the selection unit 104 reads context information indicating an occurrence probability of the context symbol from the context information storage unit 102. When both of the two symbols are context symbols, the selection unit 104 reads context information for each of the context symbols. The selection unit 104 reads range information stored in the range information storage unit 103. The range information indicates a range of real numbers that includes a value to be a basis of an arithmetic code generation processing.

The arithmetic code generation processing and range information will be described briefly.

The range (numerical range) to be a basis of arithmetic code generation processing is successively updated in accordance with an order of symbols in the symbol sequence. For convenience of explanation, symbols are assumed to be of two types (symbols B and symbols C). Symbol B represents a bypass symbol in the example embodiments of the present invention. Symbol C represents a context symbol in the example embodiments of the present invention. In this case, a symbol sequence includes symbol B and symbol C. In this case, the symbol sequence corresponds to a range of real numbers in accordance with an order of symbols included in a symbol sequence. For example, the range information is set to a range from 0 to 1 before arithmetic code generation processing of the symbol sequence. The range is updated with respect to symbol C, based on the occurrence probability of symbol C and updated with respect to symbol B based on a predetermined probability. The range is updated with respect to the symbols constituting the symbol sequence in accordance with an order of symbols constituting the symbol sequence.

For convenience of explanation, it is assumed that the predetermined probability of symbol B is 0.8, that the occurrence probability of symbol C is 0.2, and that the symbol sequence is "BCC". The range from a real number X to a real number Y is herein denoted by [X, Y].

First, with respect to the first symbol B of symbol sequence "BCC", the range 1 (=1-0) of the range [0, 1] is multiplied by the predetermined probability 0.8 of the symbol B and thereby a range [0, 0.8] is calculated. In other words, the first symbol B of symbol sequence "BCC" corresponds to the range [0, 0.8].

Next, with respect to the second symbol C of symbol sequence "BCC", the range 0.8 (=0.8-0) of the range [0, 0.8] is multiplied by the occurrence probability 0.2 of the symbol C and thereby 0.16 is calculated. In this case, the range [0, 0.8] is divided into a range [0, 0.64] and a range [0.64, 0.8] (0.64=0.8-0.16). The range [0, 0.64] represents the range in the case when the second symbol of the symbol sequence "BCC" were a symbol B. The range [0.64, 0.8] represents the range in the case when the second symbol of the symbol sequence "BCC" is a symbol C. Accordingly, the range [0, 0.8] is updated to the range [0.64, 0.8] in accordance with the second symbol C of the symbol sequence "BCC".

Next, with respect to the third symbol C of symbol sequence "BCC", the range 0.16 (=0.8-0.64) of the range [0.64, 0.8] is multiplied by the occurrence probability 0.2 of the symbol C and thereby 0.032 is calculated. In this case, the range [0.64, 0.8] is divided into a range [0.64, 0.768] and a range [0.768, 0.8] (0.768=0.8-0.032). The range [0.64, 0.768] represents the range in the case when the third symbol of symbol sequence "BCC" were a symbol B. The range [0.768, 0.8] represents the range in the case when the third symbol of symbol sequence "BCC" is a symbol C. Accordingly, the range [0.64, 0.8] is updated to the range [0.768, 0.8] in accordance with the third symbol C of the symbol sequence "BCC".

By following the arithmetic code generation processing, the symbol sequence "BCC", for example, corresponds to the range [0.768, 0.8] and a value in this range [0.768, 0.8] (e.g., the lower limit value of the range) is generated as an arithmetic code.

With reference to FIG. 1, processing of the arithmetic coding device 100 will be described. The selection unit 104 outputs range information to the processing unit indicated by the inputted destination information. When at least one of the two symbols is a context symbol, the selection unit 104 also outputs the context information for each context symbol to the processing unit. In other words, when the multi-bypass processing unit 108 is the processing unit, the selection unit 104 does not output context information to the multi-bypass processing unit 108 since neither of the two symbols is a context symbol.

With reference to FIG. 3, processing in the case when the processing unit is the multi-context processing unit 105 will be described in detail. When the processing unit is the multi-context processing unit 105, the selection unit 104 outputs two symbols, context information indicating an occurrence probability of the first symbol of the two symbols, context information indicating an occurrence probability of the second symbol, and range information to the multi-context processing unit 105. In this case, the first symbol and the second symbol of the two symbols are both context symbols.

In the multi-context processing unit 105, the context coding unit 1051 receives as inputs the first symbol, the context information indicating the occurrence probability of the first symbol, and the range information. In the multi-context processing unit 105, the context coding unit 1052 receives as inputs the second symbol, the context information indicating the occurrence probability of the second symbol, and range information updated by the context coding unit 1051.

In the context coding unit 1051, the context information update unit 1053 updates the occurrence probability indicated by the context information, based on the first symbol and the context information with respect to the first symbol. More specifically, the context information update unit 1053 increases the value of the occurrence probability of the first symbol and generates context information indicating the increased occurrence probability. In other words, the context information update unit 1053 updates the inputted context information with respect to the first symbol. The context information update unit 1053 outputs the generated context information to the range information update unit 1055. The context information update unit 1053 outputs the updated context information to the selection unit 104 and the range information update unit 1055. The selection unit 104 receives as an input the context information outputted by the context information update unit 1053 and stores the inputted context information in the context information storage unit 102.

The range information update unit 1055 receives as inputs the second symbol, the context information (the updated context information in this case) outputted by the context information update unit 1053, and the range information outputted by the selection unit 104. In the context coding unit 1051, the range information update unit 1055 updates the range information in accordance with the arithmetic code generation processing as described above, using the occurrence probability indicated by the inputted context information. The range information update unit 1055 outputs the updated range information to the context coding unit 1052.

The context coding unit 1052 receives as inputs the second symbol, the context information indicating the occurrence probability of the second symbol, and the range information outputted by the range information update unit 1055. The context coding unit 1052 executes similar processing to the processing by the above-described context coding unit 1051. As a result, in the context coding unit 1052, the context information update unit 1054 updates the context information with respect to the second symbol (context symbol in this case). The range information update unit 1056 updates the range information in accordance with the arithmetic code generation processing as described above, using the context information updated by the context information update unit 1054. The range information update unit 1056 outputs the updated range information to the selection unit 104.

In summary, the multi-context processing unit 105 outputs the context information updated with respect to the first symbol and the context information updated with respect to the second symbol to the selection unit 104. The multi-context processing unit 105 also updates the range information, based on the context information updated with respect to each of the context symbols included in the two symbols. The multi-context processing unit 105 outputs the updated range information to the selection unit 104. The selection unit 104 receives as inputs the context information and the range information outputted by the multi-context processing unit 105, stores the inputted context information in the context information storage unit 102, and stores the inputted range information in the range information storage unit 103.

The first symbol and the second symbol may be the same context symbols or different context symbols. For convenience of explanation, the multi-context processing unit 105 illustrated in FIG. 3 is capable of processing the first symbol and the second symbol that are different from each other. However, when the first symbol and the second symbol are the same symbols, the multi-context processing unit 105 may be configured in such a manner that the context information update unit 1053 updates the context information and the context information update unit 1054 directly receives as an input the context information updated by the context information update unit 1053. Alternatively, the multi-context processing unit 105 may be configured to be capable of processing the first symbol and the second symbol regardless whether they are the same context symbols or different context symbols. In such a case, the multi-context processing unit 105 is configured in such a manner as would be illustrated in the block diagram of FIG. 3 with an additional line connecting the context information update unit 1053 with the context information update unit 1054.

With reference to FIG. 4, the processing in the case when the processing unit is the context-bypass processing unit 106 will be described in detail. When the processing unit is the context-bypass processing unit 106, the selection unit 104 outputs a first symbol, context information with respect to the first symbol, a second symbol, and range information to the context-bypass processing unit 106. In this case, the first symbol is a context symbol. The second symbol is a bypass symbol.

In the context-bypass processing unit 106, the context coding unit 1061 receives as inputs the first symbol, the context information with respect to the first symbol, and the range information. The context coding unit 1061 executes processing similar to the processing executed by the context coding unit 1051 as described above with reference to FIG. 3, using the inputted first symbol and the context information with respect to the first symbol. In accordance with this processing, the context coding unit 1061 generates context information by updating the context information with respect to the first symbol. The context coding unit 1061 generates range information by updating the inputted range information based on the updated context information. The context coding unit 1061 outputs the generated range information to the bypass coding unit 1062.

The bypass coding unit 1062 receives as inputs the range information outputted by the context coding unit 1061 and the second symbol (a bypass symbol in this case) outputted by the selection unit 104. In the context-bypass processing unit 106, the range information update unit 1065 updates the inputted range information with respect to the second symbol in accordance with the arithmetic code generation processing as described above, using the predetermined probability. The range information update unit 1065 outputs the updated range information to the selection unit 104. Subsequently, the selection unit 104 executes processing similar to the processing as described above with reference to FIG. 3.

In the bypass coding unit 1062, the range information update unit 1065 does not receive as input the context information with respect to the second symbol (a bypass symbol in this case). This is because the range information update unit 1065 updates the range information with respect to the second symbol (a bypass symbol in this case), based on the predetermined probability.

With reference to FIG. 5, the processing in the case when the processing unit is the bypass-context processing unit 107 will be described. When the processing unit is the bypass-context processing unit 107, the selection unit 104 outputs a first symbol and range information to the bypass coding unit 1071 and outputs a second symbol and context information of the second symbol to the context coding unit 1072. In this case, the first symbol is a bypass symbol. The second symbol is a context symbol.

In the bypass-context processing unit 107, the range information update unit 1073 receives as inputs the range information and the first symbol outputted by the selection unit 104. The range information update unit 1073 generates range information by updating, based on the predetermined probability, the range indicated by the inputted range information with respect to the first symbol in accordance with processing similar to the processing executed by the bypass coding unit 1062 in FIG. 4. The range information update unit 1073 outputs the generated range information to the range information update unit 1075.

The context coding unit 1072 receives as inputs the range information outputted by the range information update unit 1073 and the second symbol and the context information with respect to the second symbol outputted by the selection unit 104. In the context coding unit 1072, the range information update unit 1075 generates range information by updating, based on the context information updated with respect to the second symbol, the range for the inputted range information in accordance with processing similar to the processing executed by the range information update unit 1056 in FIG. 3. The bypass-context processing unit 107 outputs the generated range information to the selection unit 104. In other words, the range information inputted to the bypass-context processing unit 107 is updated by the range information update unit 1073 in the bypass coding unit 1071 and the range information update unit 1075 in the context coding unit 1072 and the updated range information is outputted by the bypass-context processing unit 107.

With reference to FIG. 6, processing in the case when the processing unit is the multi-bypass processing unit 108 will be described. When the processing unit is the multi-bypass processing unit 108, the multi-bypass processing unit 108 receives as inputs a first symbol, a second symbol, and range information outputted by the selection unit 104. In this case the first symbol and the second symbol are both bypass symbols.

In the multi-bypass processing unit 108, the bypass coding unit 1081 inputs the first symbol and the range information outputted by the selection unit 104.

In the bypass coding unit 1081, the range information update unit 1083 updates, based on the predetermined probability, the range information with respect to the first symbol by executing processing similar to the processing executed by the range information update unit 1065 as described above with reference to FIG. 4. The range information update unit 1083 outputs the updated range information to the range information update unit 1084. The range information update unit 1084 receives as inputs the range information outputted by range information update unit 1083 and the second symbol (a bypass symbol in this case) outputted by the selection unit 104. The range information update unit 1084 updates the inputted range information with respect to the second symbol in accordance with processing similar to the processing executed by the range information update unit 1065 as described above with reference to FIG. 4. The range information update unit 1084 outputs the updated range information to the selection unit 104.

The selection unit 104 selectively receives as an input the range information outputted by one of the four processing units (the multi-context processing unit 105, the context-bypass processing unit 106, the bypass-context processing unit 107, and the multi-bypass processing unit 108). The selection unit 104 stores the inputted range information in the range information storage unit 103. When one of the processing units outputs context information, the selection unit 104 selectively receives as an input the context information and stores the inputted context information in the context information storage unit 102.

When the processing as described above with respect to all symbols in the inputted symbol sequence is completed, the output processing unit 109 performs arithmetic coding based on the inputted range information in accordance with the arithmetic code generation processing.

Figure 7:
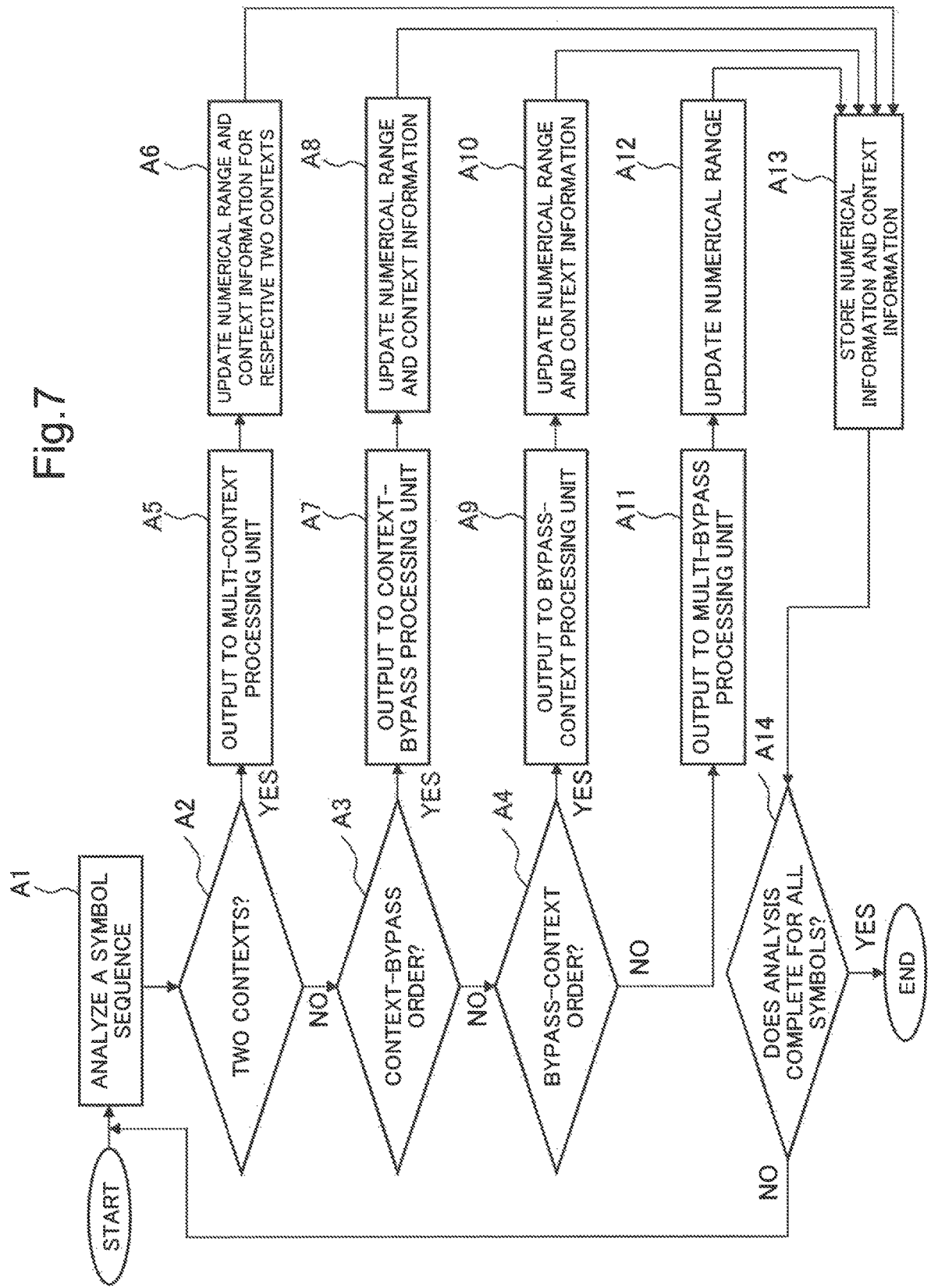
FIG. 7 is a flow chart illustrating processing of the arithmetic coding device according to the first example embodiment.

Next, with reference to FIG. 7, processing in the arithmetic coding device 100 according to the first example embodiment of the present invention will be described in detail. FIG. 7 is a flow chart illustrating processing of the arithmetic coding device 100 according to the first example embodiment.

First, the arithmetic coding device 100 receives as an input, for example, a symbol sequence outputted by an external device (not illustrated). In the arithmetic coding device 100, the symbol sequence analysis unit 101 analyzes the order of symbols in the inputted symbol sequence (step A1) and thereby generates destination information that indicates the processing unit to process two successive symbols among the symbols in the symbol sequence (determination process illustrated in step A2 to step A4).

More specifically, the symbol sequence analysis unit 101 reads two successive symbols in the inputted symbol sequence and determines, for each of the two symbols, whether it is a bypass symbol or a context symbol.

When the two symbols are both context symbols (YES in step A2), the symbol sequence analysis unit 101 selects the multi-context processing unit 105 as the processing unit to process the two symbols and generates destination information indicating the selected processing unit. The symbol sequence analysis unit 101 outputs the generated destination information and the two symbols to the selection unit 104. The selection unit 104 reads the context information with respect to each symbol from the context information storage unit 102 and also reads the range information stored in the range information storage unit 103 (range information indicating, for example, a numerical range [0, 1] in the initial state, as described above in relation to arithmetic coding).

The selection unit 104 outputs the two symbols, the context information with respect to each symbol, and the range information to the multi-context processing unit 105 (step A5). The multi-context processing unit 105 receives as inputs the two symbols, the context information with respect to the two symbols, and the range information. The multi-context processing unit 105 updates the range information and the context information for each symbol by executing the processing as described above with reference to FIG. 3, on the inputted context information and the range information (step A6). The multi-context processing unit 105 outputs the updated context information and the updated range information to the selection unit 104.

When the first symbol of the two symbols is a context symbol and the second symbol is a bypass symbol (NO in step A2 and YES in step A3), the symbol sequence analysis unit 101 selects the context-bypass processing unit 106 as the processing unit to process the two symbols and generates destination information indicating the selected processing unit. The symbol sequence analysis unit 101 outputs the generated destination information and the two symbols to the selection unit 104. The selection unit 104 reads the context information with respect to the context symbol of the two symbols from the context information storage unit 102 and also reads the range information stored in the range information storage unit 103.

The selection unit 104 outputs the two symbols, the context information with respect to the context symbol, and the range information to the context-bypass processing unit 106 (step A7). The context-bypass processing unit 106 receives as inputs the two symbols, the context information with respect to the context symbol, and the range information. The context-bypass processing unit 106 updates the range information and the context information by executing the processing as described above with reference to FIG. 4 on the inputted context information and the range information (step A8). The context-bypass processing unit 106 outputs the updated context information and the updated range information to the selection unit 104.

When the first symbol of the two symbols is a bypass symbol and the second symbol is a context symbol (NO in step A3 and YES in step A4), the symbol sequence analysis unit 101 selects the bypass-context processing unit 107 as the processing unit to process the two symbols and generates destination information indicating the selected processing unit. The symbol sequence analysis unit 101 outputs the generated destination information and the two symbols to the selection unit 104. The selection unit 104 reads the context information of the context symbol of the two symbols from the context information storage unit 102 and also reads the range information stored in the range information storage unit 103.

The selection unit 104 outputs the two symbols, the context information with respect to the context symbol, and the range information to the bypass-context processing unit 107 (step A9). The bypass-context processing unit 107 receives as inputs the two symbols, the context information with respect to the context symbol, and the range information. The bypass-context processing unit 107 updates the range information and the context information by executing the processing as described above with reference to FIG. 5 on the inputted context information and the range information (step A10). The bypass-context processing unit 107 outputs the updated context information and the updated range information to the selection unit 104.

When the two symbols are both bypass symbols (NO in step A4), the symbol sequence analysis unit 101 selects the multi-bypass processing unit 108 as the processing unit to process the two symbols and generates destination information indicating the selected processing unit. The symbol sequence analysis unit 101 outputs the generated destination information and the two symbols to the selection unit 104.

The selection unit 104 reads the range information stored in the range information storage unit 103.

The selection unit 104 outputs the two symbols and the read range information to the multi-bypass processing unit 108 (step A11). The multi-bypass processing unit 108 receives as an input the range information outputted by the selection unit 104. The multi-bypass processing unit 108 updates the range information by executing the processing as described above with reference to FIG. 6 on the inputted range information (step A12). The multi-bypass processing unit 108 outputs the updated range information to the selection unit 104.

The selection unit 104 selectively receives as an input the range information outputted by one of the four processing units and stores the inputted range information in the range information storage unit 103 (step A13). When the processing unit is the multi-context processing unit 105, the context-bypass processing unit 106, or the bypass-context processing unit 107, the selection unit 104 receives context information as an input and stores the inputted context information in the context information storage unit 102 (step A13).

The symbol sequence analysis unit 101 determines whether or not the processing on all the symbols in the inputted symbol sequence has been completed (step A14). When the processing on all the symbols in the inputted symbol sequence has been completed (YES in step A14), the arithmetic coding device 100 completes the processing for updating the range information with respect to the symbol sequence. When the processing on at least one of the symbols in the inputted symbol sequence remains (NO in step A14), the symbol sequence analysis unit 101 executes the processing of step A1 on the unprocessed symbols.

When the processing on all the symbols in the inputted symbol sequence has been completed (YES in step A14), the output processing unit 109 reads the range information stored in the range information storage unit 103. The output processing unit 109 performs arithmetic coding with respect to the read range information in accordance with the arithmetic code generation processing as described above. In other words, the output processing unit 109 performs arithmetic coding for the inputted symbol sequence by this processing.

All the processing units illustrated in FIGS. 3 to 6 execute processing on two symbols but the number of symbols to be processed may be other than two. For example, a processing unit for executing processing with respect to three symbols can be achieved by connecting coding units (context coding units or bypass coding units) in accordance with the order of the three symbols.

The processing units need not include the same number of coding units (context coding units or bypass coding units). For convenience of explanation, the processing time is assumed to be the same in the context coding units and the bypass coding units.

When all the processing units include the same number of coding units as illustrated in in FIGS. 3 to 6 (two in the examples illustrated in FIGS. 3 to 6), it is possible to accurately predict the processing time of the arithmetic coding device 100 irrespective of the order of sequence of the context symbols and the bypass symbols in the inputted symbol sequence. This is because the processing time is approximately the same in all the processing units as each processing unit processes two symbols. Therefore, when there is a need for generating an arithmetic code for a symbol sequence within a predetermined time (period), the arithmetic coding device 100 can be achieved by providing the processing units with such a number of coding units as to satisfy the processing time requirement.

Further, for example, when the symbol sequence consists of an odd number of symbols, the arithmetic coding device 100 may include a processing unit with the odd number of coding units and may include a processing unit with one coding unit. In this case, for example, the last symbol of the symbol sequence is processed by the processing unit with one coding unit.

Next, advantageous effects of the arithmetic coding device 100 according to the first example embodiment of the present invention will be described.

The arithmetic coding device 100 according to the first example embodiment of the present invention can code even a symbol sequence that includes a context symbol and a bypass symbol at a high speed. This is because the arithmetic coding device 100 includes the context-bypass processing unit 106 and the bypass-context processing unit 107 capable of processing the symbol sequence at a high speed. The reason for this will be described in detail.

The arithmetic coding device 100 according to the first example embodiment further includes the multi-context processing unit 105 capable of processing a symbol sequence including two context symbols at a high speed and the multi-bypass processing unit 108 capable of processing a symbol sequence including two bypass symbols at a high speed. Therefore, the arithmetic coding device 100 according to the first example embodiment can process two symbols in a single process. Compared with the arithmetic coding devices described in NPL 1 and the like, the arithmetic coding devices consecutively coding a symbol sequence that includes a context symbol and a bypass symbol, the arithmetic coding device 100 according to the first example embodiment reduces the processing between symbols. Therefore, the arithmetic coding device 100 according to the first example embodiment of the present invention can achieve a speedy coding even to a symbol sequence that includes a context symbol and a bypass symbol.

Second Example Embodiment

Next, a second example embodiment based on the above-described first example embodiment will be described.

In the following description, characteristic parts of the present example embodiment will be mainly described and the same constitutional parts as those of the above-described first example embodiment will be denoted by the same reference numerals and will not be further described, to avoid overlapping description.

Figure 8:
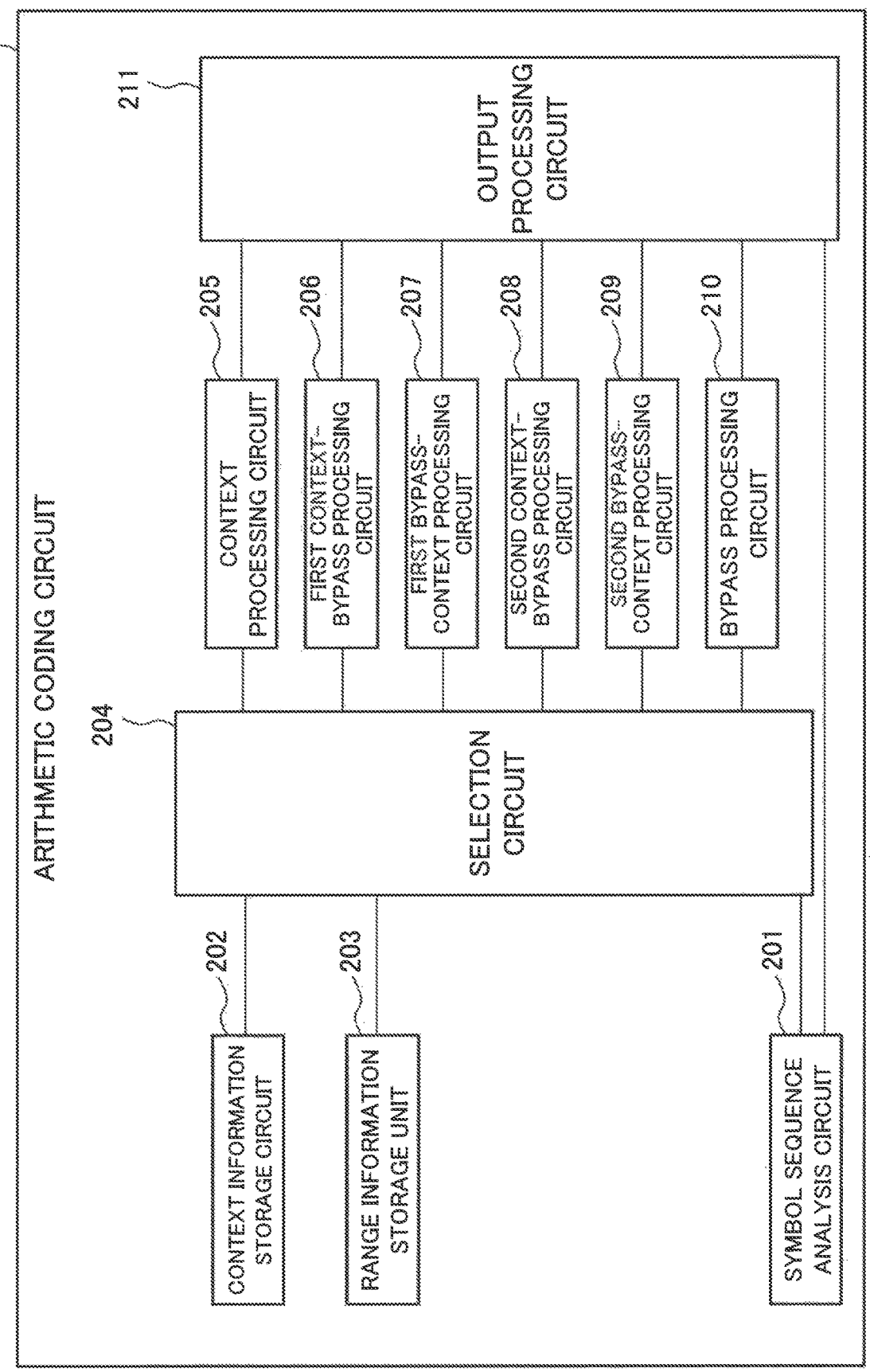
FIG. 8 is a block diagram illustrating a configuration of the arithmetic coding circuit 200 according to the second example embodiment of the present invention.

With reference to FIG. 8, a configuration of an arithmetic coding circuit 200 according to the second example embodiment of the present invention will be described in detail. FIG. 8 is a block diagram illustrating a configuration of the arithmetic coding circuit 200 according to the second example embodiment of the present invention.

The arithmetic coding circuit 200 according to the second example embodiment includes a symbol sequence analysis circuit 201, a context information storage circuit 202, a range information storage circuit 203, a selection circuit 204, a context processing circuit 205, and a first context-bypass processing circuit 206. The arithmetic coding circuit 200 further includes a first bypass-context processing circuit 207, a second context-bypass processing circuit 208, a second bypass-context processing circuit 209, a bypass processing circuit 210, and an output processing circuit 211.

The symbol sequence analysis circuit 201 has a function similar to the function of the symbol sequence analysis unit 101 (FIG. 1). The context information storage circuit 202 has a function similar to the function of the context information storage unit 102 (FIG. 1). The range information storage circuit 203 has a function similar to the function of the range information storage unit 103 (FIG. 1). The selection circuit 204 has a function similar to the function of the selection unit 104 (FIG. 1). The output processing circuit 211 has a function similar to the function of the output processing unit 109 (FIG. 1). The context processing circuit 205 has a function similar to the function of the multi-context processing unit 105 (FIG. 3). The first context-bypass processing circuit 206 has a function similar to the function of the context-bypass processing unit 106 (FIG. 4). The first bypass-context processing circuit 207 has a function similar to the function of the bypass-context processing unit 107 (FIG. 5).

Figure 9:
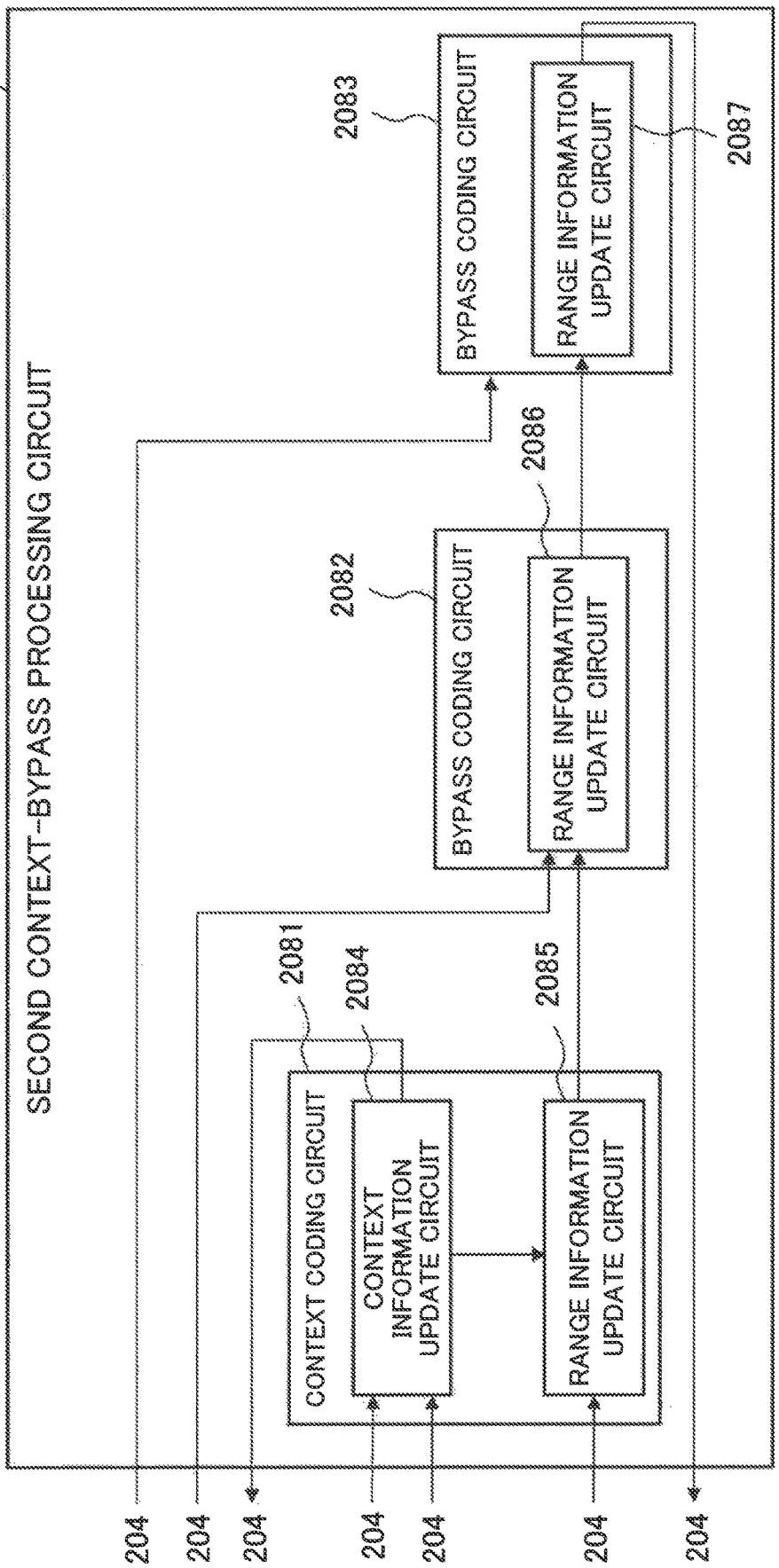
FIG. 9 is a block diagram illustrating a configuration of the second context-bypass processing circuit 208 according to the second example embodiment of the present invention.

Next, with reference to FIG. 9, a configuration of the second context-bypass processing circuit 208 will be described. FIG. 9 is a block diagram illustrating a configuration of the second context-bypass processing circuit 208 according to the second example embodiment of the present invention.

The second context-bypass processing circuit 208 includes a context coding circuit 2081, a bypass coding circuit 2082, and a bypass coding circuit 2083. The context coding circuit 2081 includes a context information update circuit 2084 and a range information update circuit 2085. The bypass coding circuit 2082 includes a range information update circuit 2086. The bypass coding circuit 2083 includes a range information update circuit 2087.

The context coding circuit 2081 has a function similar to the function of the context coding unit 1051 (FIG. 3). The context information update circuit 2084 has a function similar to the function of the context information update unit 1053 (FIG. 3). The range information update circuit 2085 has a function similar to the function of the range information update unit 1055 (FIG. 3). The bypass coding circuit 2082 and the bypass coding circuit 2083 have a function similar to the function of the bypass coding unit 1062 (FIG. 4). The range information update circuit 2086 and the range information update circuit 2087 have a function similar to the function of the range information update unit 1065 (FIG. 4). Therefore, the functions of these constitutional parts in the present example embodiment will not be described in detail.

Processing to be executed when the symbol sequence analysis circuit 201 selects the second context-bypass processing circuit 208 as destination (i.e., a processing unit described in the first example embodiment) will be described. In this case, the first symbol of the symbol sequence to be analyzed by the symbol sequence analysis circuit 201 is a context symbol and the second symbol and the third symbol are bypass symbols.

When the destination is the second context-bypass processing circuit 208, the selection circuit 204 outputs a first symbol, context information with respect to the first symbol, and range information stored in the range information storage circuit 203 to the context coding circuit 2081. The selection circuit 204 outputs a second symbol to the bypass coding circuit 2082. The selection circuit 204 outputs a third symbol to the bypass coding circuit 2083.

The context coding circuit 2081 generates updated context information with respect to the first symbol and range information updated based on the context information by executing processing similar to the processing as described above with respect to context coding unit 1051 with reference to FIG. 3. The context coding circuit 2081 outputs the generated range information to the bypass coding circuit 2082.

The bypass coding circuit 2082 receives as inputs the range information outputted by the context coding circuit 2081 and the second symbol outputted by the selection circuit 204 (a bypass symbol in this case). In the bypass coding circuit 2082, the range information update circuit 2086 generates range information by updating, based on a predetermined probability, a range for the inputted range information in accordance with the arithmetic code generation processing as described above. The range information update circuit 2086 outputs the generated range information to the bypass coding circuit 2083.

The bypass coding circuit 2083 receives as inputs the range information outputted by the bypass coding circuit 2082 and the third symbol outputted by the selection circuit 204 (a bypass symbol in this case). In the bypass coding circuit 2083, the range information update circuit 2087 generates range information by updating, based on a predetermined probability, the range for the inputted range information in accordance with the arithmetic code generation processing as described above. The range information update circuit 2087 outputs the generated range information to the selection circuit 204.

Figure 10:
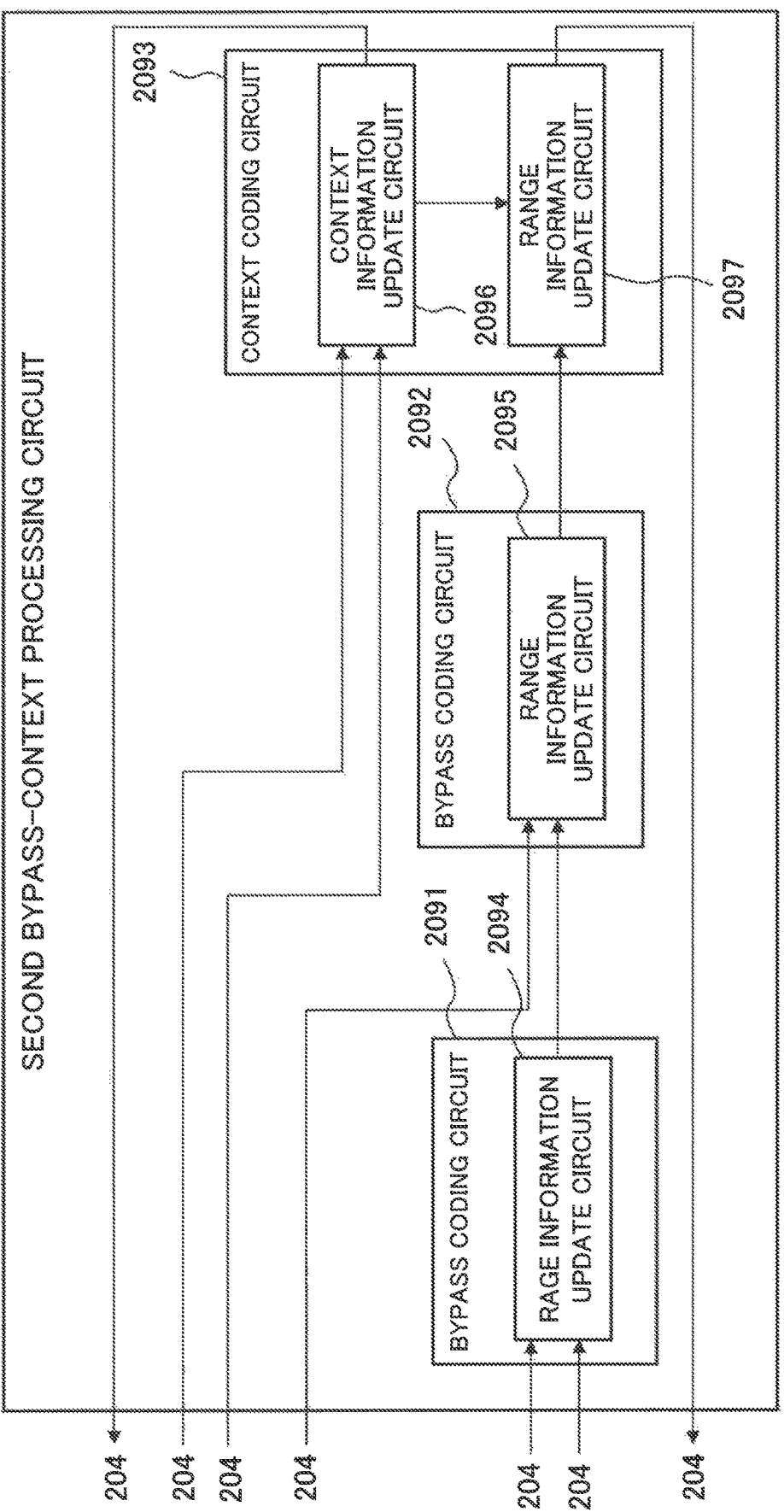
FIG. 10 is a block diagram illustrating a configuration of a second bypass-context processing circuit according to a second example embodiment of the present invention.

Next, with reference to FIG. 10, a configuration of the second bypass-context processing circuit 209 will be described. FIG. 10 is a block diagram illustrating a configuration of the second bypass-context processing circuit 209 according to the second example embodiment of the present invention.

The second bypass-context processing circuit 209 includes a bypass coding circuit 2091, a bypass coding circuit 2092, and a context coding circuit 2093. The bypass coding circuit 2091 includes a range information update circuit 2094. The bypass coding circuit 2092 includes a range information update circuit 2095. The context coding circuit 2093 includes a context information update circuit 2096 and a range information update circuit 2097.

The bypass coding circuit 2091 and the bypass coding circuit 2092 have a function similar to the function of the bypass coding unit 1062 (FIG. 4). The range information update circuit 2094 and the range information update circuit 2095 have a function similar to the function of the range information update unit 1065 (FIG. 4). The context coding circuit 2093 has a function similar to the function of the context coding unit 1051 (FIG. 3). The context information update circuit 2096 has a function similar to the function of the context information update unit 1053 (FIG. 3). The range information update circuit 2097 has a function similar to the function of the range information update unit 1055 (FIG. 3). Therefore, the functions of these constitutional parts in the present example embodiment will not be described in detail.

The processing to be executed when the symbol sequence analysis circuit 201 selects the second bypass-context processing circuit 209 as destination will be described. In this case, a first symbol and a second symbol of the symbol sequence to be analyzed by the symbol sequence analysis circuit 201 are bypass symbols and a third symbol is a context symbol.

When the destination is the second bypass-context processing circuit 209, the selection circuit 204 outputs the first symbol (a bypass symbol in this case) and the range information stored in the range information storage circuit 203 to the bypass coding circuit 2091. The selection circuit 204 outputs the second symbol (a bypass symbol in this case) to the bypass coding circuit 2092. The selection circuit 204 outputs the third symbol (a context symbol in this case) and the context information with respect to the third symbol to the context coding circuit 2093.

The bypass coding circuit 2091 receives as inputs the range information outputted by the selection circuit 204 and the first symbol (a bypass symbol in this case). In the bypass coding circuit 2091, the range information update circuit 2094 generates range information by updating, based on a predetermined probability, the range for the inputted range information in accordance with the arithmetic code generation processing as described above. The range information update circuit 2094 outputs the generated range information to the bypass coding circuit 2092.

The bypass coding circuit 2092 receives as inputs the range information outputted by the bypass coding circuit 2091 and the second symbol (a bypass symbol in this case). In the bypass coding circuit 2092, the range information update circuit 2095 generates range information by updating, based on a predetermined probability, the range for the inputted range information in accordance with the arithmetic code generation processing as described above. The range information update circuit 2095 outputs the generated range information to the context coding circuit 2093.

The context coding circuit 2093 receives as inputs the third symbol (context symbol in this case), the context information with respect to the third symbol, and the range information. The third symbol and the context information are outputted by the selection circuit 204. The range information is outputted by the bypass coding circuit 2092. In the context coding circuit 2093, the context information update circuit 2096 generates context information updated with respect to the third symbol by executing processing similar to the processing as described above with respect to the context information update unit 1053 with reference to FIG. 3. The range information update circuit 2097 generates updated range information based on the context information updated with respect to the third symbol by executing processing similar to the processing as described above with respect to the range information update unit 1055 with reference to FIG. 3. The range information update circuit 2097 outputs the generated range information to the selection circuit 204.

Figure 11:
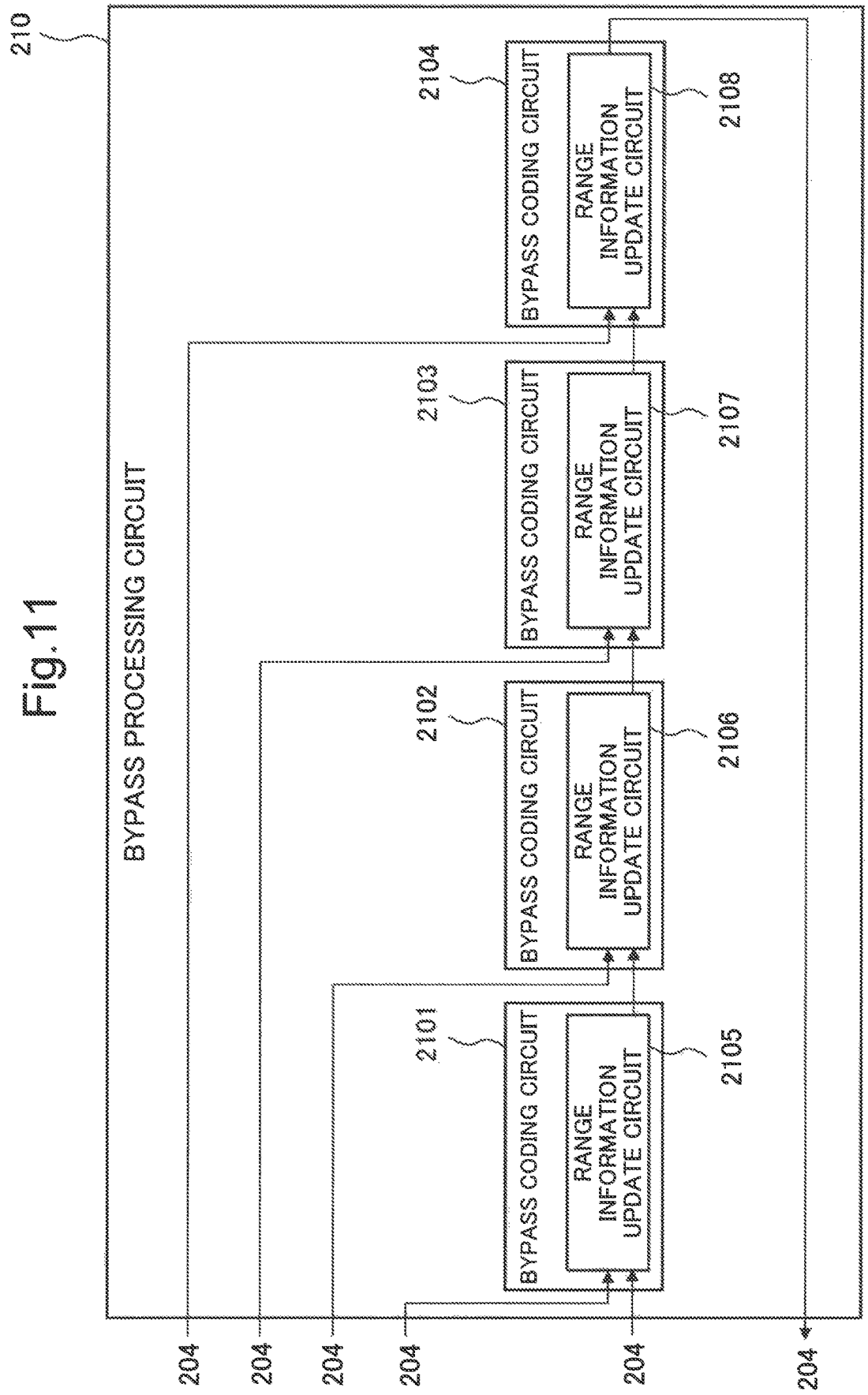
FIG. 11 is a block diagram illustrating a configuration of a bypass processing circuit according to the second example embodiment of the present invention.

Next, with reference to FIG. 11, a configuration of the bypass processing circuit 210 will be described. FIG. 11 is a block diagram illustrating a configuration of the bypass processing circuit 210 according to the second example embodiment of the present invention.

The bypass processing circuit 210 includes a bypass coding circuit 2101, a bypass coding circuit 2102, a bypass coding circuit 2103, and a bypass coding circuit 2104. The bypass coding circuit 2101 includes a range information update circuit 2105. The bypass coding circuit 2102 includes a range information update circuit 2106. The bypass coding circuit 2103 includes a range information update circuit 2107. The bypass coding circuit 2104 includes a range information update circuit 2108.

The bypass coding circuits 2101 to 2104 all have a function similar to the function of the bypass coding unit 1062 (FIG. 4). The range information update circuits 2105 to 2108 have a function similar to the function of the range information update unit 1065 (FIG. 4). Therefore, the functions of these constitutional parts in the present example embodiment will not be described in detail.

Processing to be executed when the symbol sequence analysis circuit 201 selects the bypass processing circuit 210 as destination will be described. In this case, the symbol sequence to be analyzed by the symbol sequence analysis circuit 201 includes bypass symbols only.

When the destination is the bypass processing circuit 210, the selection circuit 204 outputs a first symbol and range information stored in the range information storage circuit 203 to the bypass coding circuit 2091. The selection circuit 204 outputs a second symbol to the bypass coding circuit 2102. The selection circuit 204 outputs a third symbol to the bypass coding circuit 2103. The selection circuit 204 outputs a fourth symbol to the bypass coding circuit 2104.

The bypass coding circuit 2101 receives as inputs the range information and the first symbol (a bypass symbol in this case) outputted by the selection circuit 204. In the bypass coding circuit 2101, the range information update circuit 2105 generates range information by updating, based on a predetermined probability, the range for the inputted range information in accordance with the arithmetic code generation processing as described above. The range information update circuit 2105 outputs the generated range information to the bypass coding circuit 2102.

The bypass coding circuit 2102 receives as inputs the range information outputted by the bypass coding circuit 2101 and the second symbol outputted by the selection circuit 204 (a bypass symbol in this case). In the bypass coding circuit 2102, the range information update circuit 2106 generates range information by updating, based on a predetermined probability, the range indicated by the inputted range information in accordance with the arithmetic code generation processing as described above. The range information update circuit 2106 outputs the generated range information to the bypass coding circuit 2103.

The bypass coding circuit 2103 receives as inputs the range information outputted by the bypass coding circuit 2102 and the third symbol outputted by the selection circuit 204 (a bypass symbol in this case). In the bypass coding circuit 2103, the range information update circuit 2107 generates range information by updating, based on a predetermined probability, the range for the inputted range information in accordance with the arithmetic code generation processing as described above. The range information update circuit 2107 outputs the generated range information to the bypass coding circuit 2104.

The bypass coding circuit 2104 receives as inputs the range information outputted by the bypass coding circuit 2101 and the fourth symbol outputted by the selection circuit 204 (a bypass symbol in this case). In the bypass coding circuit 2104, the range information update circuit 2108 generates range information by updating, based on a predetermined probability, the range indicated by the inputted range information in accordance with the arithmetic code generation processing as described above. The range information update circuit 2108 outputs the generated range information to the selection circuit 204.

The symbol sequence processed by the bypass processing circuit 210 includes four bypass symbols in the above-described example but the symbol sequence need only to include at least more than one bypass symbols. When the bypass processing circuit 210 includes four bypass coding circuits, the bypass processing circuit 210 can update range information for arithmetic coding with respect to at most four bypass symbols.

Next, with reference to FIGS. 13 to 16, processing of the arithmetic coding circuit 200 according to the second example embodiment of the present invention will be described in detail. FIGS. 13 to 16 are diagrams schematically illustrating processing of the arithmetic coding circuit 200 according to the second example embodiment.

Figure 13:
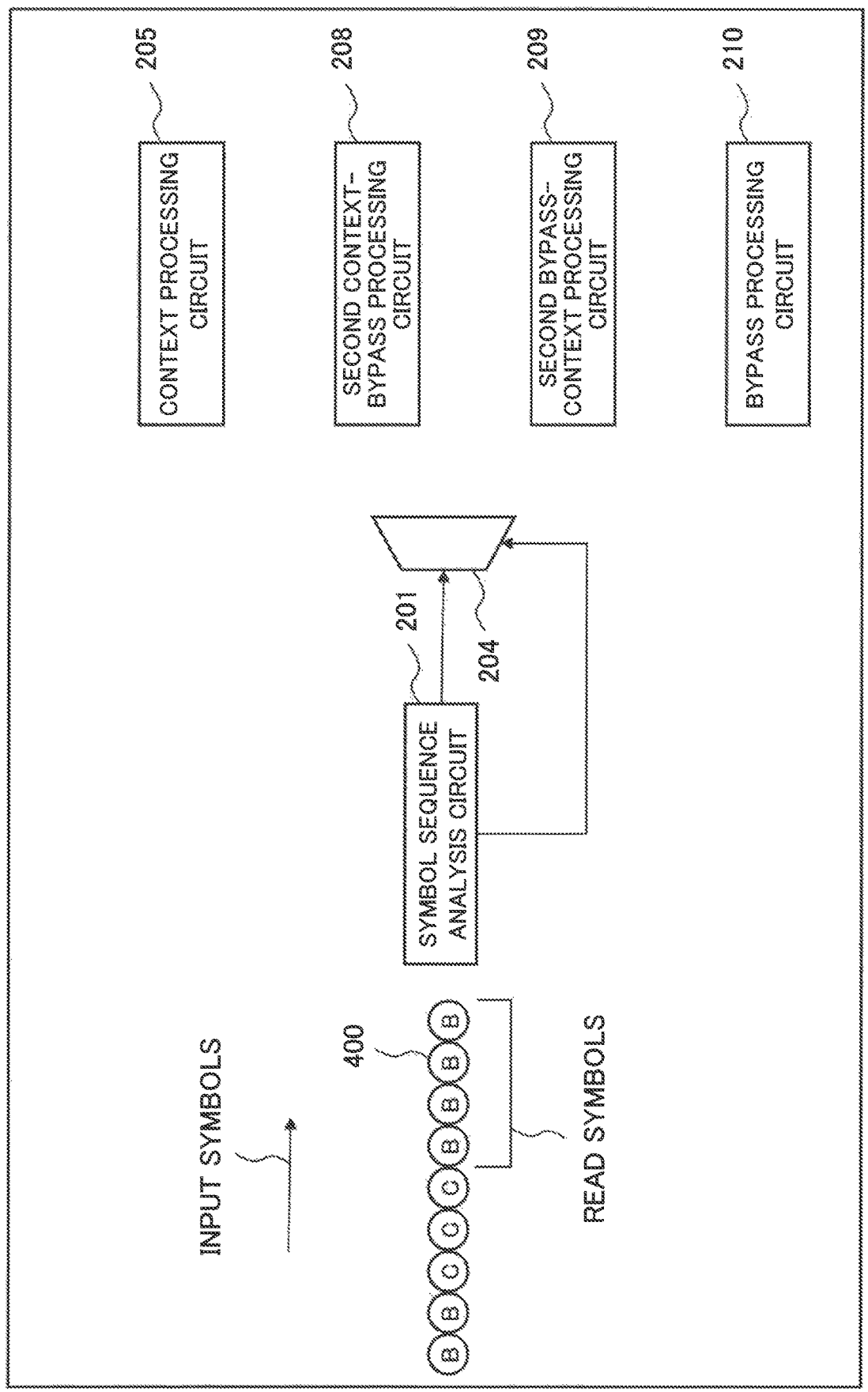
FIG. 13 is a diagram (1/4) schematically illustrating processing of the arithmetic coding circuit according to the second example embodiment.

For convenience of explanation, FIGS. 13 to 16 illustrate the symbol sequence analysis circuit 201, the selection circuit 204, the context processing circuit 205, the second context-bypass processing circuit 208, the second bypass-context processing circuit 209, and the bypass processing circuit 210. FIGS. 13 to 16 leave out the context information storage circuit 202, the range information storage circuit 203, the selection circuit 204, the first context-bypass processing circuit 206, and the first bypass-context processing circuit 207. As illustrated in FIG. 13, it is assumed that the arithmetic coding circuit 200 receives as an input a symbol sequence 400 including nine symbols (i.e., "BBBBC-CCBB"). In FIG. 13, the symbols B of the symbol sequence 400 are bypass symbols and the symbols C are context symbols.

As illustrated in FIG. 13, by analyzing the symbol sequence to be an analysis target (symbol sequence 400 in this case), the symbol sequence analysis circuit 201 specifies the first four symbols of the symbol sequence 400 as all being bypass symbols. In the symbol sequence 400, the first four symbols of the symbol sequence 400 are four repetitive symbols and accordingly the symbol sequence analysis circuit 201 outputs destination information indicating that the destination is the bypass processing circuit 210 to the selection circuit 204.

Figure 14:
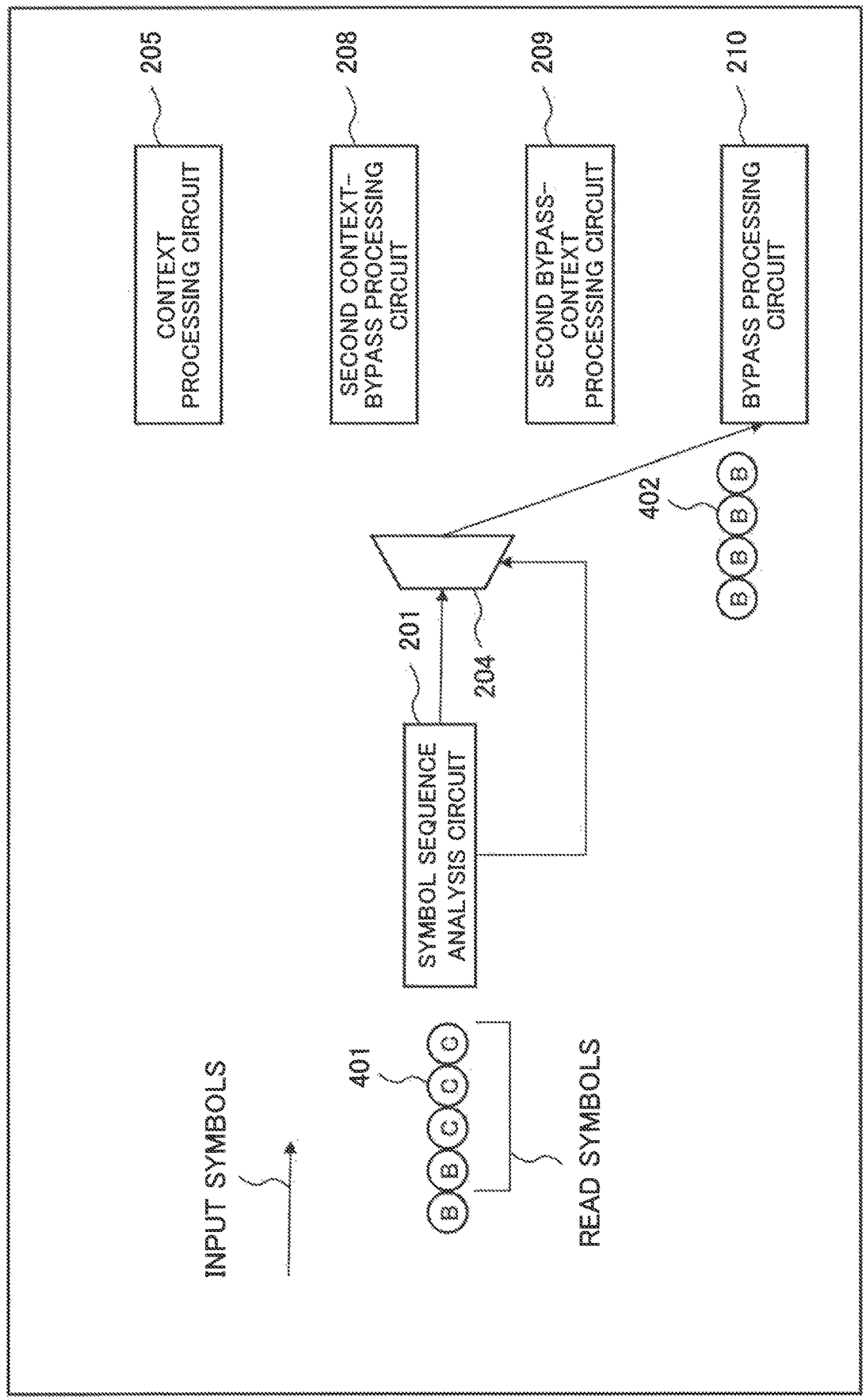
FIG. 14 is a diagram (2/4) schematically illustrating processing of the arithmetic coding circuit according to the second example embodiment.

The selection circuit 204 receives as inputs the first four symbols of the symbol sequence 400 and the destination information outputted by the symbol sequence analysis circuit 201, the destination information indicating that the destination of the four symbols is the bypass processing circuit 210. As illustrated in FIG. 13, the first four symbols of the symbol sequence 400 are all bypass symbols ("BBBB" in this case). Accordingly, as illustrated in FIG. 14, the selection circuit 204 reads range information stored in the range information storage circuit 203 and outputs the read range information and the inputted symbol sequence 402 to the bypass processing circuit 210 in accordance with the inputted destination information. The symbol sequence 401 represents a symbol sequence not yet processed for coding (i.e., the symbols other than the ones included in the symbol sequence 402) in the symbol sequence 400 of FIG. 13.

The bypass processing circuit 210 receives as inputs the symbol sequence 402 and the range information outputted by the selection circuit 204. The bypass processing circuit 210 generates range information by executing processing similar to the processing as described above with reference to FIG. 11.

As the coding processing has not been executed on the symbol sequence 401 (FIG. 14) in the symbol sequence 400 (FIG. 13), the symbol sequence analysis circuit 201 receives as inputs the first four symbols of the symbol sequence 401 ("CCCB" in this case). In this case, the first two symbols of the symbol sequence 401 are both context symbols and accordingly the symbol sequence analysis circuit 201 outputs destination information indicating that the context processing circuit 205 is selected as the destination to the selection circuit 204.

Figure 15:
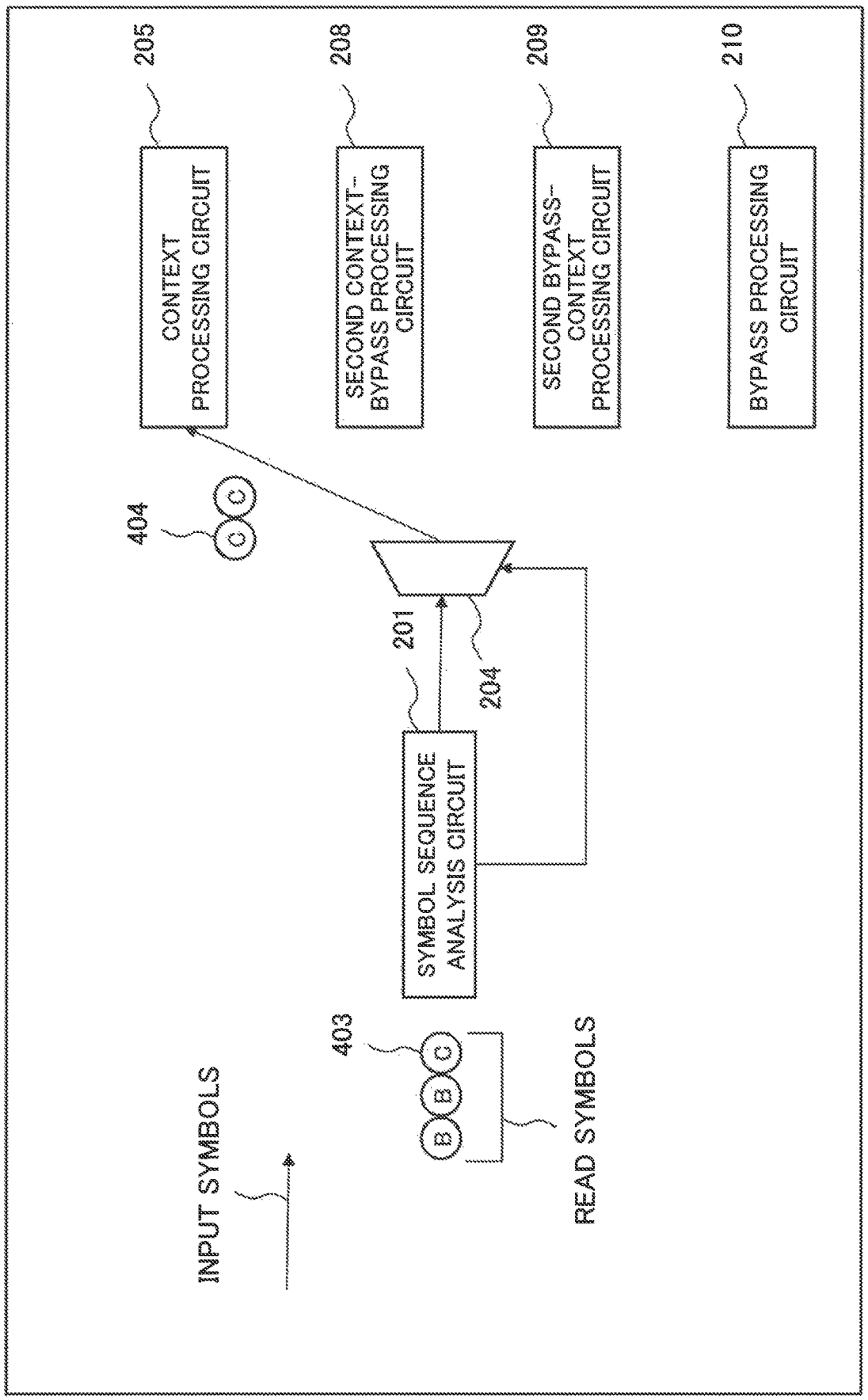
FIG. 15 is a diagram (3/4) schematically illustrating processing of the arithmetic coding circuit according to the second example embodiment.

The selection circuit 204 receives as inputs the first two symbols of the symbol sequence 401 and the destination information outputted by the symbol sequence analysis circuit 201, the destination information indicating that the destination of the two symbols is the context processing circuit 205. As illustrated in FIG. 14, the first two symbols of the symbol sequence 401 are both context symbols (i.e., "CC"). Accordingly, the selection circuit 204 reads the context information with respect to the two context symbols from the context information storage circuit 202 and also reads the range information stored in the range information storage circuit 203. As illustrated in FIG. 15, the selection circuit 204 outputs the two symbols (i.e., symbol sequence 404), the read range information, and the read context information to the context processing circuit 205 in accordance with the inputted destination information. The symbol sequence 403 is the symbol sequence remained as an unprocessed sequence in coding in the symbol sequence 401 of FIG. 14 (i.e., the symbols other than the ones in the symbol sequence 404).

The context processing circuit 205 receives as inputs the symbol sequence 404, the range information, and the context information outputted by the selection circuit 204 and generates range information and context information by executing processing similar to the processing as described above with reference to FIG. 3.

As the coding processing has not been executed on the symbol sequence 403 (FIG. 15) in the symbol sequence 401 (FIG. 14), the symbol sequence analysis circuit 201 receives as an input the symbol sequence 403. In this case, the symbols included in the symbol sequence 403 are a context symbol, a bypass symbol, and a bypass symbol in the order from the top and accordingly the symbol sequence analysis circuit 201 outputs destination information indicating that the second context-bypass processing circuit 208 is selected as destination to the selection circuit 204.

Figure 16:
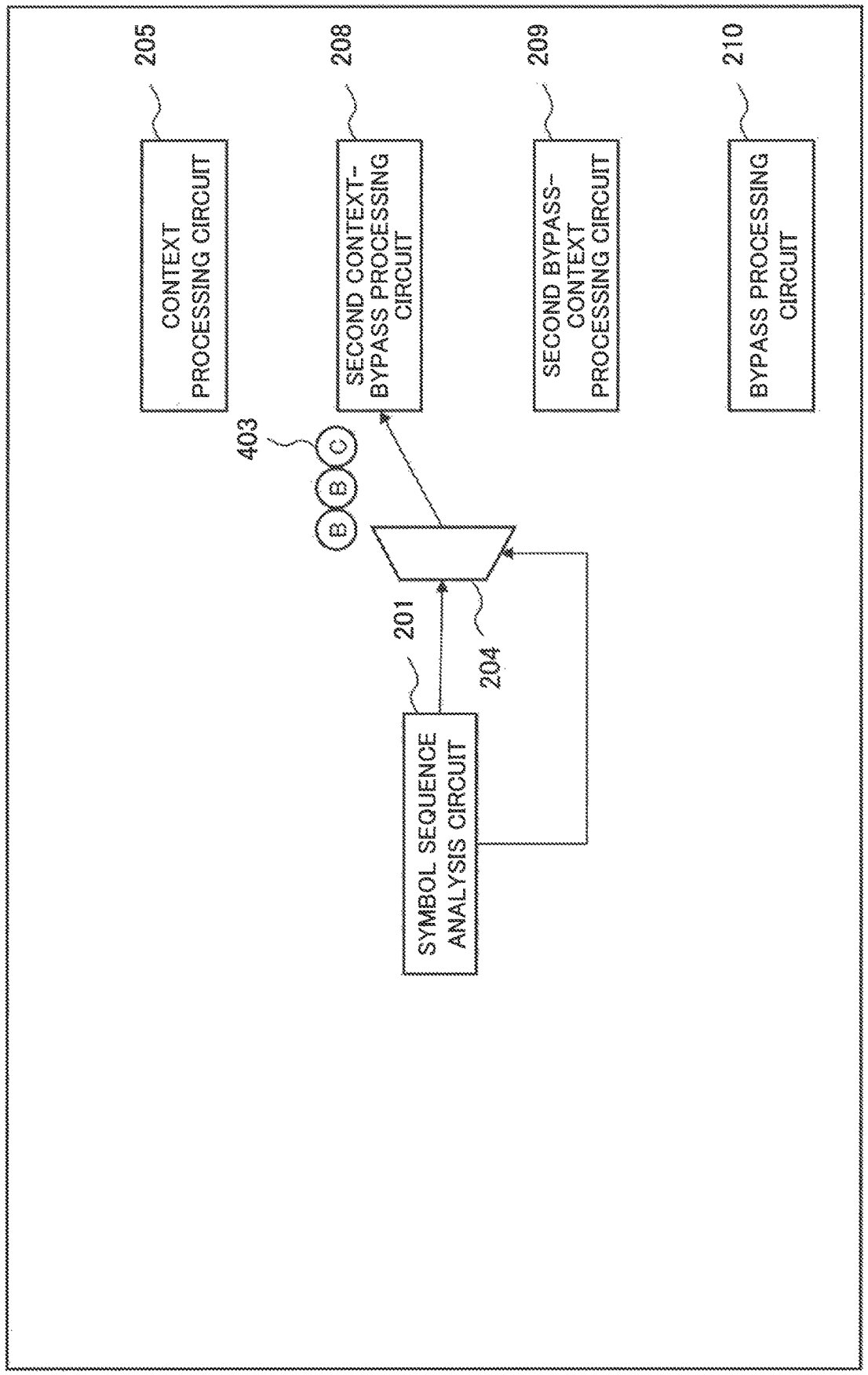
FIG. 16 is a diagram (4/4) schematically illustrating processing of the arithmetic coding circuit according to the second example embodiment.

The selection circuit 204 receives as inputs the symbol sequence 403 and the destination information outputted by the symbol sequence analysis circuit 201. The destination information indicates that the second context-bypass processing circuit 208 is the destination where the symbol sequence 403 is to be processed. As the symbol sequence 403 includes a context symbol, the selection circuit 204 reads the context information with respect to the context symbol from the context information storage circuit 202 and also reads the range information stored in the range information storage circuit 203. As illustrated in FIG. 16, the selection circuit 204 outputs the read symbol sequence 403, the read range information, and the read context information to the second context-bypass processing circuit 208 in accordance with the inputted destination information.

The second context-bypass processing circuit 208 receives as inputs the symbol sequence 403, the range information, and the context information outputted by the selection circuit 204 and generates range information and context information by executing processing similar to the processing as described above with reference to FIG. 9.

As processing has been executed on all the symbols in the symbol sequence 400 (illustrated in FIG. 13), the symbol sequence analysis circuit 201 completes the processing for analyzing the symbol sequence. In this case, the range information stored in the range information storage circuit 203 indicates the range based on which an arithmetic code with respect to the symbol sequence 400 (illustrated in FIG. 13) is generated. The output processing circuit 211 generates an arithmetic code with respect to the range information stored in the range information storage circuit 203 (i.e., an arithmetic code with respect to the symbol sequence 400) in accordance with the arithmetic code generation processing as described above.

Figure 12:
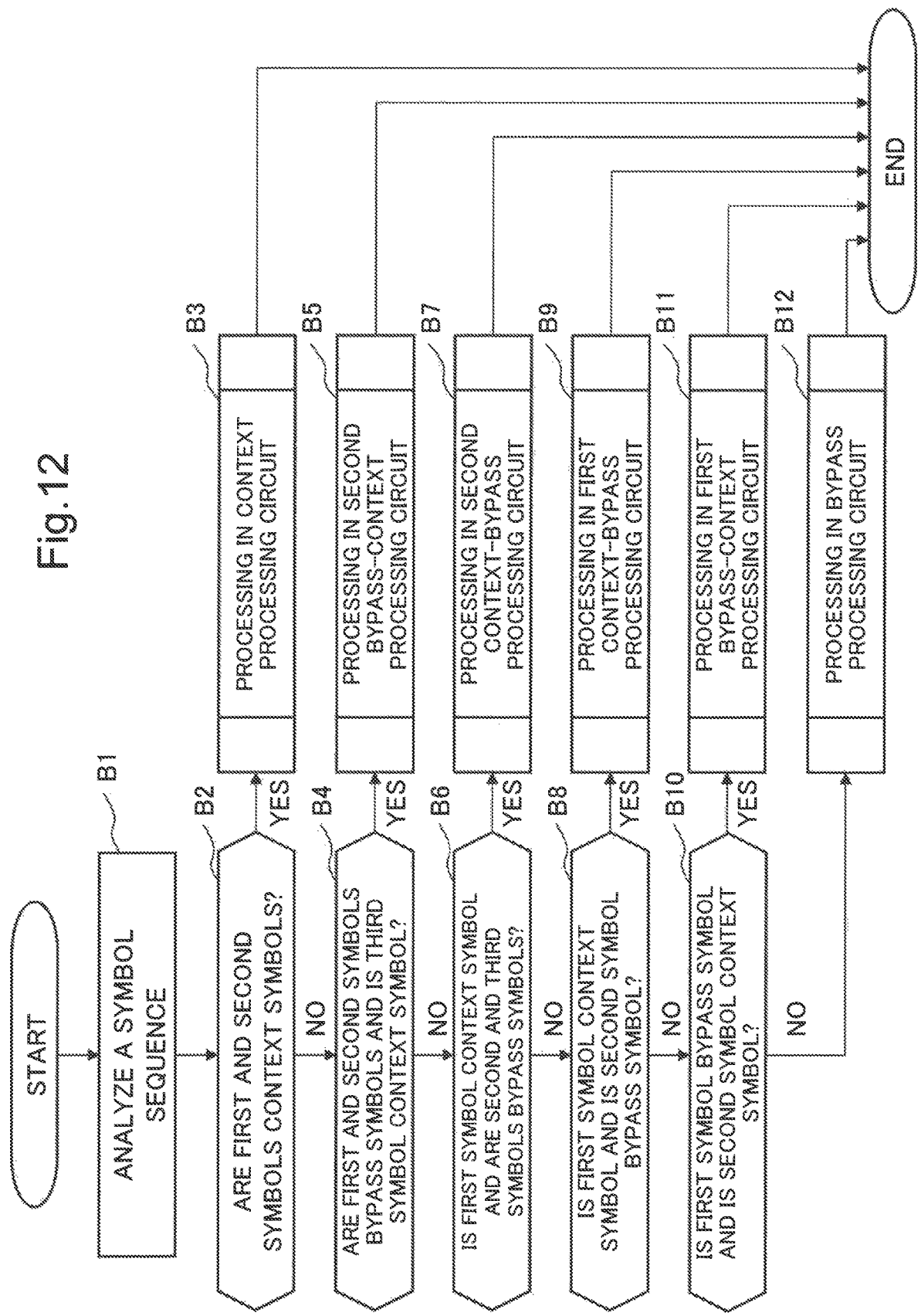
FIG. 12 is a flow chart illustrating processing of the arithmetic coding circuit according to the second example embodiment.

Next, with reference to FIG. 12, processing in the arithmetic coding circuit 200 according to the second example embodiment of the present invention will be described in detail. FIG. 12 is a flow chart illustrating processing of the arithmetic coding circuit 200 according to the second example embodiment.

The symbol sequence analysis circuit 201 receives as an input a symbol sequence to be an analysis target (e.g., the symbol sequence 400 in FIG. 13) and analyzes the inputted symbol sequence (step B1). The symbol sequence analysis circuit 201 generates, based on the inputted symbol sequence, destination information indicating the destination where a plurality of symbols located at the top of the symbol sequence (to be referred to as a "top symbol sequence" for convenience of explanation) are to be processed, and outputs the top symbol sequence and the generated destination information to the selection circuit 204.

The selection circuit 204 receives as inputs the symbol sequence and the destination information outputted by the symbol sequence analysis circuit 201. Subsequently, the selection circuit 204 reads the range information stored in the range information storage circuit 203. When the inputted top symbol sequence includes a context symbol, the selection circuit 204 reads the context information with respect to the context symbol from the context information storage circuit 202.

The selection circuit 204 selects a destination based on the inputted destination information (step B2, step B4, step B6, step B8, and step B10) and outputs the inputted top symbol sequence and the range information. When the top symbol sequence includes a context symbol, the selection circuit 204 further outputs the context information to the destination.

More specifically, when the top symbol sequence consists of two context symbols (YES in step B2), the selection circuit 204 outputs the top symbol sequence, the context information, and the range information to the context processing circuit 205. The context processing circuit 205 receives as inputs the top symbol sequence, the context information, and the range information outputted by the selection circuit 204 and executes processing similar to the processing as described above with reference to FIG. 3 (step B3).

When the first symbol of the inputted top symbol sequence is a bypass symbol, the second symbol is a bypass symbol, and the third symbol is a context symbol (NO in step B2, YES in step B4), the selection circuit 204 outputs the top symbol sequence, the context information, and the range information to the second bypass-context processing circuit 209. The second bypass-context processing circuit 209 receives as inputs the top symbol sequence, the context information, and the range information outputted by the selection circuit 204 and executes processing similar to the processing as described above with reference to FIG. 10 (step B5).

When the first symbol of the inputted top symbol sequence is a context symbol, the second symbol is a bypass symbol, and the third symbol is a bypass symbol (NO in step B4, YES in step B6), the selection circuit 204 outputs the top symbol sequence, the context information, and the range information to the second context-bypass processing circuit 208. The second context-bypass processing circuit 208 receives as inputs the top symbol sequence, the context information, and the range information outputted by the selection circuit 204 and executes processing similar to the processing as described above with reference to FIG. 9 (step B7).

When the first symbol of the inputted top symbol sequence is a context symbol and the second symbol is a bypass symbol (NO in step B6, YES in step B8), the selection circuit 204 outputs the top symbol sequence, the context information, and the range information to the first context-bypass processing circuit 206. The first context-bypass processing circuit 206 receives as inputs the top symbol sequence, the context information, and the range information outputted by the selection circuit 204 and executes processing similar to the processing as described above with reference to FIG. 4 (step B9).

When the first symbol of the inputted top symbol sequence is a bypass symbol and the second symbol is a context symbol (NO in step B8, YES in step B10), the selection circuit 204 outputs the top symbol sequence, the context information, and the range information to the first bypass-context processing circuit 207. The first bypass-context processing circuit 207 receives as inputs the top symbol sequence, the context information, and the range information outputted by the selection circuit 204 and executes processing similar to the processing as described above with reference to FIG. 5 (step B11).

In the case of NO in step B10 (i.e., the first symbol and the second symbol of the inputted top symbol sequence are both bypass symbols) the selection circuit 204 outputs the top symbol sequence, the context information, and the range information to the bypass processing circuit 210. The bypass processing circuit 210 receives as inputs the top symbol sequence, the context information, and the range information outputted by the selection circuit 204 and executes processing similar to the processing as described above with reference to FIG. 11 (step B12).

Next, like the processing in step A14 illustrated in FIG. 7, when the processing on the symbols included in the inputted symbol sequence has not been completed (this corresponds to step A14 in FIG. 7), the arithmetic coding circuit 200 executes the processing of step B1. In other words, the processing of step B1 to step B12 is repeated until the coding processing on all the symbols in the inputted symbol sequence is completed.

A case will be considered in which it is assumed that, for example, the time required for the processing in the bypass coding circuit is half (or approximately half) the time required for the processing in the context coding circuit. On this assumption, when the arithmetic coding circuit 200 needs to generate an arithmetic code for a symbol sequence within a predetermined time (period), the arithmetic coding circuit 200 according to the second example embodiment is suitably configured to complete the processing within the predetermined time. This is because the variation of the time required for the processing between the destinations selected by the selection circuit 204 is within half the time required for processing one bypass symbol and hence it is possible to estimate the processing time of the arithmetic coding circuit 200.

Next, advantageous effects of the arithmetic coding circuit 200 according to the second example embodiment of the present invention will be described.

The arithmetic coding circuit 200 according to the second example embodiment of the present invention can achieve fast coding even for a symbol sequence that includes a context symbol and a bypass symbol. This is because the arithmetic coding circuit 200 includes the first context-bypass processing circuit 206 and the first bypass-context processing circuit 207 capable of processing the symbol sequence at a high speed.

Further, the arithmetic coding circuit 200 according to the second example embodiment allows even faster coding than in the first example embodiment. This is because the processing by the constitutional parts included in the arithmetic coding circuit 200 allows more symbols to be processed than can be processed by the arithmetic coding device 100 according to the first example embodiment.

Third Example Embodiment

Next, a third example embodiment of the present invention will be described.

In the following description, characteristic parts of the present example embodiment will be mainly described and the same constitutional parts as those of the above-described example embodiments of the present invention will be denoted by the same reference numerals and will not be further described, to avoid overlapping description.

Figure 17:
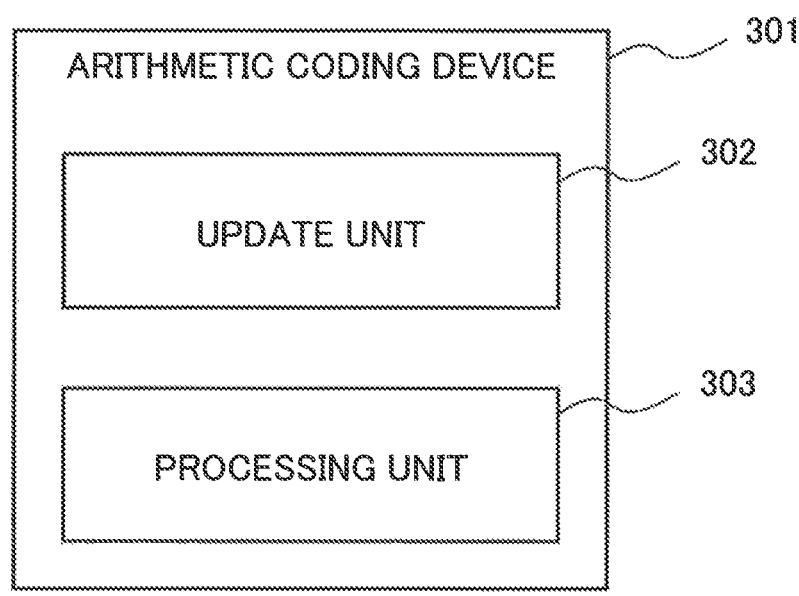
FIG. 17 is a block diagram illustrating a configuration of an arithmetic coding device according to a third example embodiment of the present invention.

With reference to FIG. 17, a configuration of an arithmetic coding device 301 according to the third example embodiment of the present invention will be described in detail. FIG. 17 is a block diagram illustrating a configuration of the arithmetic coding device 301 according to the third example embodiment of the present invention.

The arithmetic coding device 301 according to the third example embodiment includes an update unit (updater) 302 and a processing unit (processor) 303.

Next, the processing of the arithmetic coding device 301 according to the third example embodiment will be described.

The update unit 302 receives as an input a symbol sequence including a context symbol as the first symbol and a bypass symbol as the second symbol. In other words, the update unit 302 receives as an input a symbol sequence that includes a context symbol and a bypass symbol.

The update unit 302 receives, as an input, context information indicating the occurrence probability of the context symbol in the symbol sequence to be coded and updates the inputted context information. In other words, as the inputted symbol sequence includes a context symbol, the update unit 302 updates the context information by increasing occurrence probability indicated by the inputted context information.

Next, the update unit 302 updates the range (i.e., numerical range) indicated by the range information based on the occurrence probability indicated by the updated context information in accordance with the procedure as described above with respect to arithmetic coding. The range information is a basis of arithmetic code for the symbol sequence. The update unit 302 executes arithmetic code generation processing with respect to the context symbol by the above-described processing.

The update unit 302 updates, based on a predetermined probability, the numerical range updated with respect to the context symbol in accordance with the procedure as described above with respect to arithmetic coding. The update unit 302 executes arithmetic code generation processing with respect to the bypass symbol by the above-described processing.

The update unit 302 makes an output to the processing unit 303.

The processing unit 303 receives as an input the range information outputted by the update unit 302 and generates an arithmetic code based on the range information in accordance with the procedure as described above with respect to arithmetic coding. In other words, the arithmetic code generated by the processing unit 303 is an arithmetic code with respect to the symbol sequence inputted to the arithmetic coding device 301.

The update unit 302 may be achieved by using, for example, the function of the context-bypass processing unit 106 (FIG. 1) or the first context-bypass processing circuit 206 (FIG. 8). Further, the processing unit 303 may be achieved by using, for example, the function of the output processing unit 109 (FIG. 1) or the output processing circuit 211 (FIG. 8). In other words, the arithmetic coding device 301 may be achieved by using, for example, the function of the arithmetic coding device 100 (FIG. 1) or the arithmetic coding circuit 200 (FIG. 8).

Next, advantageous effects of the arithmetic coding device 301 according to the third example embodiment will be described.

The arithmetic coding device 301 according to the third example embodiment can achieve fast coding even to a symbol sequence that includes a context symbol and a bypass symbol. This is because the arithmetic coding device 301 includes the update unit 302 capable of processing the symbol sequence at a high speed. In other words, this is because the arithmetic coding device 301 can execute the coding processing on a context symbol and a bypass symbol in a single execution. Compared with the arithmetic coding devices described in NPL 1 and the like, which consecutively code a symbol sequence that includes a context symbol and a bypass symbol, the arithmetic coding device 301 according to the third example embodiment reduces the processing between symbols. Therefore, the arithmetic coding device 301 according to the third example embodiment of the present invention can achieve fast coding to even a symbol sequence that includes a context symbol and a bypass symbol.

The arithmetic coding device 100 illustrated in FIG. 1, the arithmetic coding circuit 200 illustrated in FIG. 8, or the arithmetic coding device 301 illustrated in FIG. 17 executes the above-described arithmetic code generation processing in a calculation processing device 501 as illustrated in FIG. 18. FIG. 18 is a block diagram illustrating a configuration of the calculation processing device 501 including an arithmetic coding device 503.

The calculation processing device 501 includes a central processing unit (CPU) 502 and an arithmetic coding device 503. The arithmetic coding device 503 is, for example, the arithmetic coding device 100 illustrated in FIG. 1, the arithmetic coding circuit 200 illustrated in FIG. 8, or the arithmetic coding device 301 illustrated in FIG. 17.

In the calculation processing device 501, the arithmetic coding device 503 executes processing for generating an arithmetic code as described above, for example, with respect to a video image data. In this case, the CPU 502 gives a command to the arithmetic coding device 503 to execute coding with respect to the video image and receives as an input the arithmetic code that the arithmetic coding device 503 generates in accordance with the command. The CPU 502 can execute the processing with respect to the video image without delay by receiving as an input the data coded by the arithmetic coding device 503 within a predetermined time after giving the command.

Note that the arrows in FIGS. 2 to 6, FIGS. 9 to 11, and other drawings represent example directions and do not limit the direction of signals between units or circuits.

The present invention has been described using the above-described example embodiments as example cases. However, the present invention is not limited to the above-described example embodiments. In other words, the present invention is applicable with various aspects that can be understood by those skilled in the art without departing from the scope of the present invention.

This application is based upon and claims the benefit of priority from Japanese patent application No. 2016-096693, filed on May 13, 2016, the disclosure of which is incorporated herein in its entirety.

INDISTRIAL APPLICABILITY

The above-described arithmetic coding device can be applied to data communication processing and data storage processing employing arithmetic coding according to a standard such as H.265. Further, the above-described arithmetic coding device can be applied to uses such as broadcasting employing coding with respect to a still image and a video image, monitoring, video streaming through mobile communication network, and telemedicine.

REFERENCE SIGNS LIST 100 arithmetic coding device
101 symbol sequence analysis unit
102 context information storage unit
103 range information storage unit
104 selection unit
105 multi-context processing unit
106 context-bypass processing unit
107 bypass-context processing unit
108 multi-bypass processing unit
109 output pressing unit
1041 input context information selection unit
1042 output context information processing unit
1043 input range information selection unit
1044 output range information selection unit
1045 input multi-symbol selection unit
1051 context coding unit
1052 context coding unit
1053 context information update unit
1054 context information update unit
1055 range information update unit
1056 range information update unit
1061 context coding unit
1062 bypass coding unit
1063 context information update unit
1064 range information update unit
1065 range information update unit
1071 bypass coding unit
1072 context coding unit
1073 range information update unit
1074 context information update unit
1075 range information update unit
1081 bypass coding unit
1082 bypass coding unit
1083 range information update unit
1084 range information update unit
200 arithmetic coding circuit
201 symbol sequence analysis circuit
202 context information storage circuit
203 range information storage circuit
204 selection circuit
205 context processing circuit
206 first context-bypass processing circuit
207 first bypass-context processing circuit
208 second context-bypass processing circuit
209 second bypass-context processing circuit
210 bypass processing circuit
211 output pressing circuit
2081 context coding circuit
2082 bypass coding circuit
2083 bypass coding circuit
2084 context information update circuit
2085 range information update circuit
2086 range information update circuit
2087 range information update circuit
2091 bypass coding circuit
2092 bypass coding circuit
2093 context coding circuit
2094 range information update circuit 2095 range information update circuit
2096 context information update circuit
2097 range information update circuit
2101 bypass coding circuit
2102 bypass coding circuit
2103 bypass coding circuit
2104 bypass coding circuit
2105 range information update circuit
2106 range information update circuit
2107 range information update circuit
2108 range information update circuit
400 symbol sequence
401 symbol sequence
402 symbol sequence
403 symbol sequence
404 symbol sequence
301 arithmetic coding device
302 update unit
303 processing unit
501 calculation processing device
502 CPU
503 arithmetic coding device

What is claimed is:

1. An arithmetic coding device comprising:
a updater configured to update an occurrence probability of a context symbol for a symbol sequence including the context symbol and a bypass symbol, update a numerical range for the symbol sequence based on the updated occurrence probability, and update the updated numerical range based on a predetermined probability, the numerical range being a basis of an arithmetic code, the numerical range being updated in accordance with the occurrence probability of the context symbol and the predetermined probability for the bypass symbol; and
a processor configured to generate an arithmetic code of the symbol sequence based on the numerical range updated by the updater in accordance with a procedure of generating the arithmetic code.

2. The arithmetic coding device according to claim 1, wherein
the updater includes a context-bypass processor and a bypass-context processor,
the context-bypass processor and the bypass-context processor include:
a context coder configured to update the occurrence probability of the context symbol and update the numerical range for the symbol sequence based on the updated occurrence probability, and
a bypass coder configured to update the numerical range for the symbol sequence based on the predetermined probability,
wherein in the context-bypass processor, the bypass coder updates the numerical range updated by the context coder, and
in the context-bypass processor, the context coder updates the numerical range updated by the bypass coder.

3. The arithmetic coding device according to claim 2, wherein
the updater includes a multi-context processor and a multi-bypass processor,
the multi-context processor includes a plurality of context coders,
the multi-bypass processor includes a plurality of bypass coders,
in the multi-context processor, a context coder updates the numerical range updated by another context coder, and
multi-bypass processor, a bypass coder update the numerical range updated by another bypass coder.

4. The arithmetic coding device according to claim 3 further comprising
a selector configured to select, as a destination of processing a second symbol sequence, the context-bypass processor, the bypass-context processor, the multi-context processor, or the multi-bypass processor in accordance with an order of symbols in the second symbol sequence, and output the numerical range based on the second symbol sequence to the selected destination, the second symbol sequence including the context symbol or the bypass symbol.

5. The arithmetic coding device according to claim 3, wherein
the number of the context coders and the bypass coders in the context-bypass processor, the number of the context coders and the bypass coders in the bypass-context processor, the number of the context coders in the multi-context processor, and the number of the bypass coders in the multi-bypass processor are consistent with one another.

6. The arithmetic coding device according to claim 2, wherein
the updater includes a second context-bypass processor,
the second context-bypass processor includes the context coder, a first bypass coder, and a second bypass coder,
in the second context-bypass processor, the first bypass coder updates the numerical range updated by the context coder, and
in the second bypass coder, the second bypass coder updates the numerical range updated by the first bypass coder.

7. The arithmetic coding device according to claim 2, wherein
the updater includes a second bypass-context processor,
the second bypass-context processor includes the context coder, a third bypass coder, and a fourth bypass coder,
in the second bypass-context processor, the fourth bypass coder updates the numerical range updated by the third bypass coder, and
the context coder updates the numerical range updated by fourth bypass coder.

8. An arithmetic coding method comprising:
updating an occurrence probability of a context symbol for a symbol sequence including the context symbol and a bypass symbol, updating a numerical range for the symbol sequence based on the updated occurrence probability, and updating the updated numerical range based on a predetermined probability, the numerical range being a basis of an arithmetic code, the numerical range being updated in accordance with the occurrence probability of the context symbol and the predetermined probability for the bypass symbol; and
generating an arithmetic code of the symbol sequence based on the updated numerical range in accordance with a procedure of generating the arithmetic code.

9. An arithmetic coding circuit comprising:
an update circuit configured to update an occurrence probability of a context symbol for a symbol sequence including the context symbol and a bypass symbol, update a numerical range for the symbol sequence based on the updated occurrence probability, and update the updated numerical range based on a predetermined probability, the numerical range being a basis of an arithmetic code, the numerical range being updated in accordance with the occurrence probability of the context symbol and the predetermined probability for the bypass symbol; and
a processing circuit configured to generate an arithmetic code of the symbol sequence based on the numerical range updated by the update circuit in accordance with a procedure of generating the arithmetic code.

10. The arithmetic coding circuit according to claim 9, wherein
the update circuit includes a context-bypass processing circuit and a bypass-context processing circuit,
the context-bypass processing circuit and the bypass-context processing circuit include:
a context coding circuit configured to update the occurrence probability of the context symbol and updating the numerical range for the symbol sequence based on the updated occurrence probability and
a bypass coding circuit configured to update the numerical range for the symbol sequence based on the predetermined probability,
wherein in the context-bypass processing circuit, the bypass coding circuit updates the numerical range updated by the context coding circuit, and
in the context-bypass processing circuit, the context coding circuit updates the numerical range updated by the bypass coding circuit.

* * * * *